(12) United States Patent
Ohtsu et al.

(10) Patent No.: US 6,499,004 B1
(45) Date of Patent: *Dec. 24, 2002

(54) SIMULATION METHOD AND APPARATUS USING A FOURIER TRANSFORM

(75) Inventors: Shinichi Ohtsu, Kawasaki (JP); Makoto Mukai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/216,982

(22) Filed: Dec. 21, 1998

(30) Foreign Application Priority Data

Apr. 7, 1998 (JP) .............................. 10-094156

(51) Int. Cl.$^7$ .......................... G06F 7/60; G06F 17/10; G06G 7/48; G06G 7/50
(52) U.S. Cl. ..................... 703/6; 703/2; 703/3; 703/4; 703/5
(58) Field of Search ................... 703/3–6, 2

(56) References Cited

U.S. PATENT DOCUMENTS

| 5,621,649 | A |   | 4/1997 | Iwata et al. |       |
|-----------|---|---|--------|--------------|-------|
| 5,650,935 | A |   | 7/1997 | Nishino et al. |     |
| 5,745,370 | A | * | 4/1998 | Ohtsu et al. | 716/3 |
| 5,903,477 | A | * | 5/1999 | Otsu et al.  | 703/5 |
| 6,083,266 | A | * | 7/2000 | Ohtsu et al. | 703/2 |

FOREIGN PATENT DOCUMENTS

EP      0 778 533       6/1997

OTHER PUBLICATIONS

Jackson et al.; "Series expansion for the mutual coupling in microstrip patch arrays"; IEEE Trans. Antennas and Propagation; pp. 269–274, Mar. 1989.*

C.D. Taylor, R.S. Satterwite, and C.W. Harrison, Jr., "The response of a terminated two–wire transmission line excited by a nonuniform electromagnetic field".

H.N. Wang, J.H. Richmond and M.C. Gilreath: "Sinusoidal reaction formulation for radiation and scattering from conducting surface".

* cited by examiner

Primary Examiner—Hugh M. Jones
(74) Attorney, Agent, or Firm—Staas & Halsey LLP

(57) ABSTRACT

Solving simultaneous equations of the moment method defining relationships between a mutual impedance between elements of an electronic apparatus, a wave source, and an electric current flowing in each element so as to simulate an electric current, provided with a unit for calculating the mutual impedance at a sampling frequency and calculating approximation coefficients, when expressing the mutual impedance by approximation expressions in terms of exponents and exponent powers, from the calculated values and sampling frequency; a unit for forming the simultaneous differential equations by setting the approximation coefficients and initial value with respect to the simultaneous differential equations derived by performing a Fourier transform on the simultaneous equations of the moment method in which the approximation expressions are substituted; and a unit for calculating the electric current in the time domain flowing through the specified element by solving the simultaneous differential equations formed.

20 Claims, 21 Drawing Sheets

$$R_i = \alpha \frac{k}{A_i} \int_{t_0}^{t_i} \int_{z_0}^{z_i} [\sin ku \, \sin kv \, \cos\phi_i$$

$$-\cos ku \, \cos kv] \frac{\sin kd}{r} dz dt$$

$$= \alpha \frac{k}{A_i} \int_{t_0}^{t_i} \int_{z_0}^{z_i} \{[ku - \frac{(ku)^3}{6}][kv - \frac{(kv)^3}{6}]\cos\phi_i$$

$$-[1 - \frac{(ku)^2}{2}][1 - \frac{(kv)^2}{2}]\} [kd - \frac{(kd)^3}{6}] \frac{1}{r} dz dt$$

$$= \alpha \frac{k}{A_i} \int_{t_0}^{t_i} \int_{z_0}^{z_i} \{[uvk^2 - \frac{uv^3 + u^3v}{6} k^4 + \frac{u^3v^3}{36} k^8]\cos\phi_i$$

$$-[1 - \frac{u^2 + v^2}{2} k^2 + \frac{u^2v^2}{4} k^4]\} [kd - \frac{(kd)^3}{6}] \frac{1}{r} dz dt$$

$$\begin{bmatrix} Z_{11} & Z_{12} & Z_{13} & \cdots & Z_{1N} \\ Z_{21} & Z_{22} & Z_{23} & \cdots & Z_{2N} \\ Z_{31} & Z_{32} & Z_{33} & \cdots & Z_{3N} \\ \vdots & \vdots & \vdots & & \vdots \\ Z_{m1} & Z_{m2} & Z_{m3} & \cdots & Z_{mN} \\ \vdots & \vdots & \vdots & & \vdots \\ Z_{N1} & Z_{N2} & Z_{N3} & \cdots & Z_{NN} \end{bmatrix} \begin{bmatrix} I_1 \\ I_2 \\ I_3 \\ \vdots \\ I_m \\ \vdots \\ I_N \end{bmatrix} = \begin{bmatrix} V_1 \\ V_2 \\ V_3 \\ \vdots \\ V_m \\ \vdots \\ V_N \end{bmatrix}$$

$$\begin{bmatrix} Z^o c,c & Z^o c,d & B^o c,d \\ Z^o d,c & Z^o d,d+Z^d d,d & B^o d,d+B^d d,d \\ B^o d,c & B^o d,d+B^d d,d & -Y^o d,d-Y^d d,d \end{bmatrix} \begin{bmatrix} I_{c,n} \\ I_{d,n} \\ M_n \end{bmatrix} = \begin{bmatrix} V_i \\ 0 \\ 0 \end{bmatrix}$$

$$Z = j\omega \iint_s \left[ \frac{\mu}{4\pi} J_1 \cdot J_2 \cos\phi \frac{e^{-jkr}}{r} + \frac{1}{4\pi\varepsilon} \rho_1 \rho_2 \frac{e^{-jkr}}{r} \right] ds$$

Fig.11A $$Z_{13} = \frac{j\omega\mu}{4\pi \sin kd_1 \sin kd_3} \int_{t_0}^{t_1}\int_{z_0}^{z_1} [\sin k(z-z_0)\sin k(t-t_0)\cos\phi_1$$
$$-\cos k(z-z_0)\cos k(t-t_0)] \frac{e^{-jkr}}{r} dzdt$$

$$Z_{14} = \frac{j\omega\mu}{4\pi \sin kd_1 \sin kd_4} \int_{t_1}^{t_2}\int_{z_0}^{z_1} [\sin k(z-z_0)\sin k(-t+t_2)\cos\phi_2$$
$$+\cos k(z-z_0)\cos k(-t+t_2)] \frac{e^{-jkr}}{r} dzdt$$

Fig.11B

Fig.12A $$\frac{j\omega\mu}{4\pi \sin kd_1 \sin kd_3} = j\frac{c\mu}{4\pi}\frac{k}{\sin kd_1 \sin kd_3} = j\alpha\frac{k}{A_1}$$

$$\frac{j\omega\mu}{4\pi \sin kd_1 \sin kd_4} = j\frac{c\mu}{4\pi}\frac{k}{\sin kd_1 \sin kd_4} = j\alpha\frac{k}{A_2}$$

Fig.12B $$Z_{13} = j\alpha\frac{k}{A_1} e^{-jkr_0} \int_{t_0}^{t_1}\int_{z_0}^{z_1} [\sin k(z-z_0)\sin k(t-t_0)\cos\phi_1 \\ -\cos k(z-z_0)\cos k(t-t_0)] \frac{e^{-jkd}}{r} dzdt$$

$$Z_{14} = j\alpha\frac{k}{A_1} e^{-jkr_0} \int_{t_1}^{t_2}\int_{z_0}^{z_1} [\sin k(z-z_0)\sin k(-t+t_2)\cos\phi_2 \\ +\cos k(z-z_0)\cos k(-t+t_2)] \frac{e^{-jkd}}{r} dzdt$$

Fig.13
$$\begin{cases} R_1 = \alpha \frac{k}{A_1} \int_{t_0}^{t_1} \int_{z_0}^{z_1} [\sin ku \ \sin kv \cos\phi_1 \\ \qquad\qquad\qquad\qquad -\cos ku \ \cos kv] \frac{\sin kd}{r} dzdt \\ = \alpha \frac{k}{A_1} \int_{t_0}^{t_1} \int_{z_0}^{z_1} \{[ku - \frac{(ku)^3}{6}][kv - \frac{(kv)^3}{6}]\cos\phi_1 \\ \qquad -[1 - \frac{(ku)^2}{2}][1 - \frac{(kv)^2}{2}]\} [kd - \frac{(kd)^3}{6}] \frac{1}{r} dzdt \\ = \alpha \frac{k}{A_1} \int_{t_0}^{t_1} \int_{z_0}^{z_1} \{[uvk^2 - \frac{uv^3 + u^3v}{6} k^4 + \frac{u^3v^3}{36} k^8]\cos\phi_1 \\ \qquad -[1 - \frac{u^2 + v^2}{2} k^2 + \frac{u^2v^2}{4} k^4]\} [kd - \frac{(kd)^3}{6}] \frac{1}{r} dzdt \end{cases}$$

Fig.14
$$\begin{cases} = \alpha \frac{1}{A_1} \int_{t_0}^{t_1} \int_{z_0}^{z_1} \{[uvdk^4 - (\frac{uv^3 + u^3v}{6} d + \frac{uvd^3}{6})k^6 \\ \qquad + (\frac{u^3v^3}{36} d + \frac{(uv^3 + u^3v)d^3}{36})k^8 - \frac{u^3v^3d^3}{216}k^{10}]\cos\phi_1 \\ \qquad -dk^2 + (\frac{u^2 + v^2}{2} d + \frac{d^3}{6})k^4 - (\frac{u^2v^2}{4} d + \frac{u^2 + v^2}{12} d^3)k^6 \\ \qquad + \frac{u^2v^2}{24} d^3k^8]\} \frac{1}{r} dzdt \end{cases}$$

Fig.15
$$\begin{cases} I_1 = \alpha \frac{k}{A_1} \int_{t_o}^{t_1}\int_{z_o}^{z_1} [\sin ku \sin kw \cos\phi_1 \\ \qquad\qquad\qquad\qquad + \cos ku \cos kw] \frac{\cos kd}{r} dzdt \\ = \alpha \frac{k}{A_1} \int_{t_o}^{t_1}\int_{z_o}^{z_1} \{[ku - \frac{(ku)^3}{6}][kw - \frac{(kw)^3}{6}]\cos\phi_1 \\ \qquad - [1 - \frac{(ku)^2}{2}][1 - \frac{(kw)^2}{2}]\} [1 - \frac{(kd)^2}{2}]\frac{1}{r} dzdt \\ = \alpha \frac{k}{A_1} \int_{t_o}^{t_1}\int_{z_o}^{z_1} \{[uwk^2 - \frac{uw^3 + u^3w}{6}k^4 + \frac{u^3w^3}{36}k^6]\cos\phi_1 \\ \qquad - [1 + \frac{u^2+w^2}{2}k^2 - \frac{u^2w^2}{4}k^4]\} [1 - \frac{(kd)^2}{2}] \frac{1}{r} dzdt \end{cases}$$

Fig.16
$$\begin{cases} = \frac{\alpha}{A_1} \int_{t_o}^{t_1}\int_{z_o}^{z_1} \{[uwk^3 - (\frac{uw^3+u^3w}{6} + \frac{uwd^2}{2})k^5 \\ \qquad + (\frac{u^3w^3}{36} + \frac{uw^3+u^3w}{12}d^2)k^7 - \frac{u^3w^3}{72}d^2k^9]\cos\phi_1 \\ \qquad -k + (\frac{u^2+w^2}{2} + \frac{d^2}{2})k^3 - (\frac{u^2w^2}{4} + \frac{u^2+w^2}{4}d^2)k^5 \\ \qquad + \frac{u^2w^2}{8}d^2k^7\} \frac{1}{r} dzdt \end{cases}$$

Fig.18A
$$\begin{cases} \text{UNIT VECTOR:} \\ \text{MONOPOLE} \langle 1 \rangle \quad (s_x, s_y, s_z) = (0, 0, 1) \\ \text{MONOPOLE} \langle 3 \rangle \quad (t_x, t_y, t_z) = (\sin\phi_1, 0, \cos\phi_1) \\ \text{MONOPOLE} \langle 4 \rangle \quad \quad\quad\quad\quad (\sin\phi_2, 0, \cos\phi_2) \\ \rho \text{ DIRECTION} \quad (V_x, V_y, V_z) = (x/\rho, h/\rho, 0) \\ \phi \text{ DIRECTION} \quad (W_x, W_y, W_z) = (-h/\rho, x/\rho, 0) \end{cases}$$

Fig.18B
$$\begin{cases} H\phi = \dfrac{1}{\mu} \nabla \times A = \dfrac{1}{\mu} \left( \dfrac{\partial A\rho}{\partial z} - \dfrac{\partial A_z}{\partial \rho} \right) \\ \\ \text{SINCE } A\rho = 0 \quad H\phi = -\dfrac{1}{\mu} \dfrac{\partial A_z}{\partial \rho} \end{cases}$$

Fig.18C
$$\begin{cases} B = -h \displaystyle\int_t^M M \dfrac{H\phi}{\rho} \sin\phi\, h\, dt \\ \\ = \dfrac{h}{\mu} \displaystyle\int_t M \dfrac{1}{\rho} \dfrac{\partial A_z}{\partial \rho} \sin\phi\, dt \end{cases}$$

Fig.19
$$\begin{cases} A_z = \dfrac{\mu}{4\pi} \int_z J \dfrac{e^{-jkr}}{r} dz \\[6pt] \rho = (x^2+h^2)^{1/2} \\[6pt] r = \{\rho^2+(z-z')^2\}^{1/2} = (z^2+t^2-2zt\cos\phi+h^2)^{1/2} \\[4pt] \qquad z': \text{Z-COORDINATE OF MONOPOLES } \langle 3 \rangle \text{ AND } \langle 4 \rangle \\[6pt] \dfrac{dr}{d\rho} = \dfrac{\rho}{r} \\[6pt] \dfrac{\partial A_z}{\partial \rho} = \dfrac{\mu}{4\pi} \int_z J \dfrac{\partial}{\partial \rho} \dfrac{e^{-jkr}}{r} dz \\[6pt] \qquad = \int_z J\left(-jk \dfrac{\rho}{r^2} e^{-jkr} - \dfrac{\rho}{r^3} e^{-jkr}\right) dz \end{cases}$$

Fig.20A
$$\begin{cases} B = \dfrac{h}{4\pi} \int_t \int_z JM \dfrac{1}{\rho} \dfrac{\partial}{\partial \rho} \dfrac{e^{-jkr}}{r} \sin\phi\, dzdt \\[6pt] = \dfrac{h\sin\phi}{4\pi} \int_t \int_z JM\left[-\dfrac{jk}{r^2} - \dfrac{1}{r^3}\right] e^{-jkr} dzdt \end{cases}$$

Fig.20B
$$\begin{cases} B \simeq \dfrac{h\sin\phi}{4\pi} e^{-jkr_0} \int_t \int_z MJ\left[-\dfrac{jk}{r^2} - \dfrac{1}{r^3}\right] e^{-jkd} dzdt \end{cases}$$

Fig.21
$$\begin{cases} B_{13} = \dfrac{h_1 \sin\phi_1}{4\pi \sin kd_1 \sin kd_3} e^{-jkr_0} \int_t \int_z \sin k(z-z_0) \\ \qquad\qquad \sin k(t-t_0) \left[ -\dfrac{jk}{r^2} - \dfrac{1}{r^3} \right] e^{-jkd} \, dzdt \\ \\ B_{14} = \dfrac{h_2 \sin\phi_2}{4\pi \sin kd_1 \sin kd_4} e^{-jkr_0} \int_t \int_z \sin k(z-z_0) \\ \qquad\qquad \sin k(t_2-t) \left[ -\dfrac{jk}{r^2} - \dfrac{1}{r^3} \right] e^{-jkd} \, dzdt \end{cases}$$

$$\begin{aligned}
&\int_t \int_z \sin ku \sin kv \left[-\frac{1}{r^3}\right] e^{-jkd} \, dz \, dt \\
&= -\int_t \int_z \left[ku - \frac{(ku)^3}{6}\right]\left[kv - \frac{(kv)^3}{6}\right][\cos kd - j\sin kd]\frac{1}{r^3} \, dz \, dt \\
&= -\int_t \int_z \left\{\left[ku - \frac{(ku)^3}{6}\right]\left[kv - \frac{(kv)^3}{6}\right]\left[1 - \frac{(kd)^2}{2}\right] \right. \\
&\quad \left. -j\left[ku - \frac{(ku)^3}{6}\right]\left[kv - \frac{(kv)^3}{6}\right]\left[kd - \frac{(kd)^3}{6}\right]\right\} \frac{1}{r^3} \, dz \, dt
\end{aligned}$$

Fig.22

Fig.23
$$\begin{cases} =-\int_t \int_z \{uvk^2 - \dfrac{u^3v+uv^3+3uvd^2}{6}k^4 \\ \quad + \dfrac{u^3v^3+3u^3vd^2+3uv^3d^2}{36}k^6 - \dfrac{u^3v^3d^2}{72}k^8 \\ \quad -j[uvdk^3 - \dfrac{u^3vd+uv^3d+uvd^3}{6}k^5 \\ \quad + \dfrac{u^3v^3d+u^3vd^3+uv^3d^3}{36}k^7 - \dfrac{u^3v^3d^3}{216}k^9]\} \dfrac{1}{r^3} dzdt \end{cases}$$

Fig.24
$$\begin{cases} \int_t \int_z \sin ku \, \sin kv [-\dfrac{jk}{r^2}]e^{-jkd} dzdt \\ =-\int_t \int_z \{uvk^2 - \dfrac{u^3v+uv^3+3uvd^2}{6}k^4 \\ \quad + \dfrac{u^3v^3+3u^3vd^2+3uv^3d^2}{36}k^6 - \dfrac{u^3v^3d^2}{72}k^8 \\ \quad -j[uvdk^3 - \dfrac{u^3vd+uv^3d+uvd^3}{6}k^5 \\ \quad + \dfrac{u^3v^3d+u^3vd^3+uv^3d^3}{36}k^7 - \dfrac{u^3v^3d^3}{216}k^9]\} \dfrac{jk}{r^2} dzdt \end{cases}$$

Fig.25 $\begin{cases} = -\displaystyle\int_t \int_z \Big\{ uvdk^4 - \dfrac{u^3vd + uv^3d + uvd^3}{6} k^6 \\[2mm] \qquad + \dfrac{u^3v^3d + u^3vd^3 + uv^3d^3}{36} k^8 - \dfrac{u^3v^3d^3}{216} k^{10} \\[2mm] \qquad + j \Big[ uvk^3 - \dfrac{u^3v + uv^3 + 3uvd^2}{6} k^5 \\[2mm] \qquad + \dfrac{u^3v^3 + 3u^3vd^2 + 3uv^3d^2}{36} k^7 - \dfrac{u^3v^3d^2}{72} k^9 \Big] \Big\} \dfrac{1}{r^2} dzdt \end{cases}$

SIMULATION METHOD AND APPARATUS USING A FOURIER TRANSFORM

BACKGROUND OF THE INVENTION

1. Field of the Invention

The present invention relates to a simulation apparatus and method for simulating an electric current flowing in an electronic apparatus and an intensity of an electromagnetic field radiated from the electronic apparatus by using the moment method and to a memory medium storing a program for realizing the simulation apparatus therein, more particularly relates to a simulation apparatus and method using the moment method for making simulation in the time domain possible and a memory medium storing a program for realizing the simulation apparatus therein.

One of the rules imposed by society on electronic apparatuses is that they should not emit more than a predetermined level of undesired radio waves or noise. This is now being strictly regulated by the standards of many countries.

A variety of technologies, such as shielding technologies and filtering technolgies, are used in order to satisfy such radio wave regulations, but use of these requires the development of simulation technology for making it possible to quantitatively simulate to which degree they can reduce the radio waves.

Another rule imposed on electronic apparatuses by society is that they should not be influenced by less than a predetermined level of radio waves or noise radiated from other electronic apparatuses. This too is now being strictly regulated by the standards of many countries.

2. Description of the Related Art

In order to satisfy such radio wave regulations, development of simulation technology for making it possible to clarify why an electronic apparatus radiates undesired radio waves or noise or why an electronic apparatus malfunctions due to the radio waves or noise is necessary.

Development of the latter simulation technology requires a simulation apparatus which can simulating the electric current changing over time which will flow in an electronic apparatus due to noise or the like and the intensity of the electromagnetic field changing over time which is radiated from the electronic apparatus. Nevertheless, no such simulation apparatus for simulating such an electric current and the intensity of an electromagnetic field changing over time has yet been commercialized. The reason for this will be explained in detail later with reference to the drawings.

SUMMARY OF THE INVENTION

An object of the present invention is to provide a novel simulation apparatus and method using a moment method which uses approximation expressions explained in detail later to make it possible to simulate a temporally changing electric current changing over time which flows in an electronic apparatus due to noise or the like and an intensity of an electromagnetic field changing over time which is radiated from an electronic apparatus and to provide a memory medium storing a program for realizing the simulation apparatus therein.

To attain the above object, the present invention is of a configuration which simulates an electric current by solving simultaneous equations of the moment method defining a relationship among the mutual impedance between elements of the electronic apparatus, a wave source, and the electric current flowing through the elements and, here, is provided with a means for calculating the mutual impedance at a sampling frequency and calculating approximation coefficients for when expressing the mutual impedance by a defined approximation expression from the calculated value and the sampling frequency; a means for forming simultaneous differential equations by setting the calculated approximation coefficients and an initial value for the simultaneous differential equations derived by performing a Fourier transform on the simultaneous equations of the moment method into which the approximation expression has been substituted; and a means for calculating the electric current of the time domain flowing in a specified element by solving the formed simultaneous differential equations.

BRIEF DESCRIPTION OF THE DRAWINGS

The above object and features of the present invention will be more apparent from the following description of the preferred embodiments given with reference to the accompanying drawings, in which:

FIGS. 11A, 11B, 12A, 12B, 13, 14, 15, 16, 17, 18A, 18B, 18C, 19, 20A, 20B, 21, 22, 23, 24, and 25 are explanatory views of the process for deriving the approximation expression.

DESCRIPTION OF THE PREFERRED EMBODIMENTS

Figure 1:
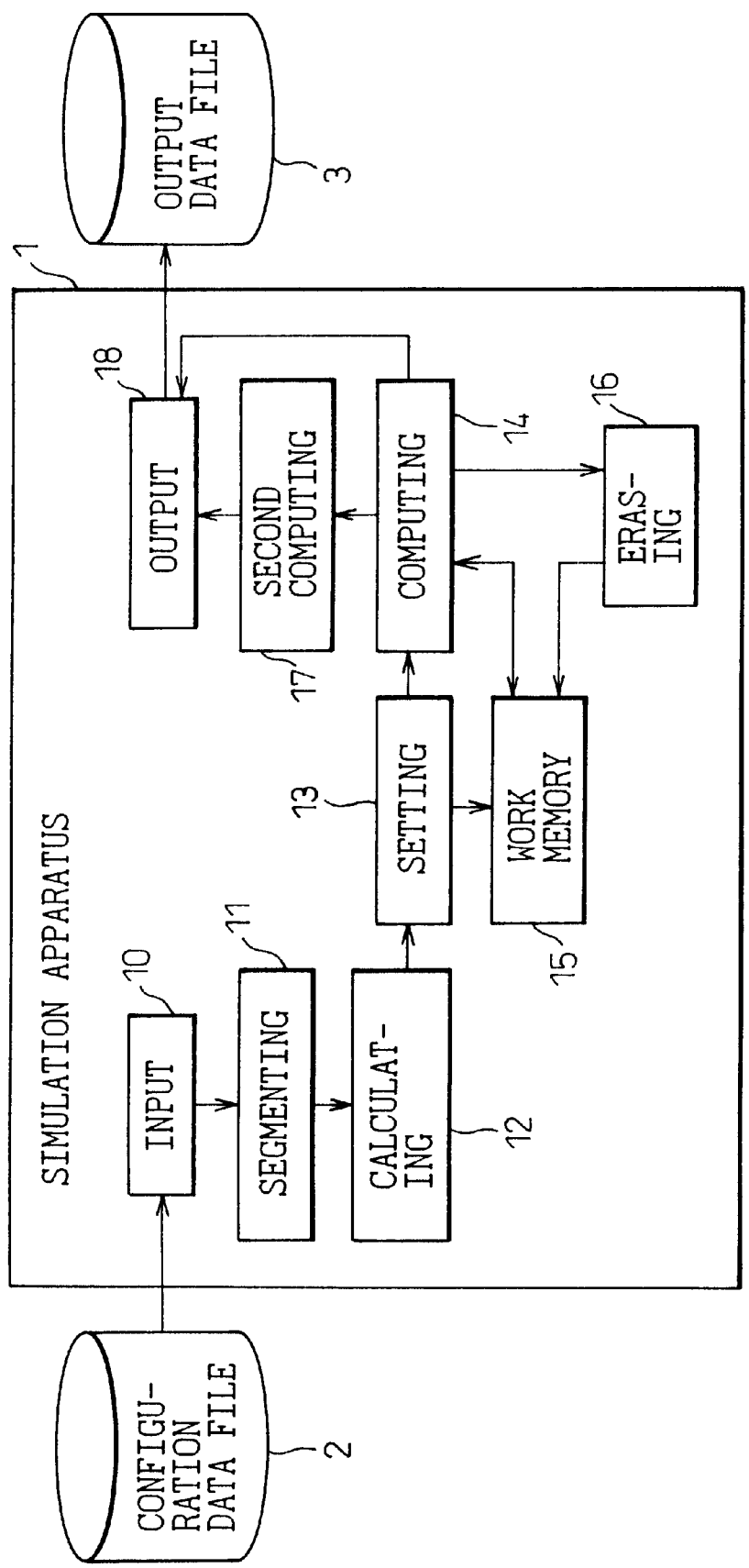
FIG. 1 is a view of the basic configuration of the present invention.

Before describing the embodiments of the present invention, the related art and the disadvantages therein will be described with reference to the related figures.

In order to satisfy the radio wave regulations explained above, development of simulation technology for making it possible to clarify why an electronic apparatus radiates undesired radio waves or noise or why an electronic apparatus malfunctions due to radio waves or noise is necessary As explained earlier, the latter simulation technology requires a simulation apparatus which can simulate the electric current changing over time which will flow in an electronic apparatus due to noise or the like and the intensity of the electromagnetic field changing over time which is radiated from the electronic apparatus. Nevertheless, no such simulation apparatus for simulating such an electric current and the intensity of an electromagnetic field changing over time has yet been commercialized. The reason for this will be explained in detail below.

The intensity of an electromagnetic field radiated from any shape of an object can be easily calculated by using known theoretical equations if an electric current and magnetic current flowing through the parts of the object are known. This electric current and magnetic current can be theoretically obtained by solving Maxwell's electromagnetic equations under the given boundary conditions.

One method for this is the moment method. The moment method is one of the methods for solving integration equations derived from Maxwell's electromagnetic equations and calculates the electric current and magnetic current by dividing an object into small elements. It can handle any three-dimensionally shaped object. As a reference document for this moment method, there is "H. N. Wang, J. H. Richmond, and M. C. Gilreath: "Sinusoidal reaction formulation for radiation and scattering from conducting surface", IEEE TRANSACTIONS ANTENNAS PROPAGATION, vol. AP-23, 1975".

On the other hand, in order to clarify why an electronic apparatus radiates undesired radio waves or noise and why an electronic apparatus malfunctions due to radio waves or noise, analysis in the time domain is necessary. This is because much of what causes an electronic apparatus to malfunction is pulse-like noise. Further, malfunctions of an electronic apparatus frequently occur due to abnormal operation of the internal ICs and other devices. It is necessary to conduct observations over time in order to confirm the abnormal operation of such devices.

A leading method for time domain analysis at the present time is the finite difference method. However, with the finite difference method, while analysis is possible in the time domain, it is difficult to handle an electronic apparatus comprised of variety of structures such as transmission lines, cables, a housing, and other parts.

Namely, in the finite difference method, it is necessary to segment the object to be analyzed and its surrounding three-dimensional space, therefore if finely segmenting it in accordance with small parts such as cable terminating portions, since the space including the housing and cables is huge, the number of segments becomes enormous and and the internal memory capacity of the computer ends up becoming overloaded. Conversely, if roughly segmenting it in accordance with the structure of the cables and housing, it becomes impossible to analyze the effects due to the cable terminating portions etc. playing an important role in the mechanism.

Further, in the finite difference method, an orthogonal coordinate system is generally used as the coordinate system for the segmentation. However, the cables and the cable terminating portions which play important roles in the mechanism are comprised of cylindrical elements, while the housing of the apparatus may take any shape. Due to this, there is the difficult question of how best to segment the object to be analyzed.

In this regard, the moment method is free from such a problem, so is suited for handling an electronic apparatus comprised of transmission lines, cables, a housing, and other parts having a large area.

Namely, this is because the moment method is a type of boundary element method where it is sufficient to two-dimensionally segment only a boundary surface, where a segmentation pitch can be considerably freely determined, and where small parts can be finely segmented and cables, housings, and the like can be roughly segmented, so the number of segments can be made much smaller compared with the finite element method and finite difference method. Further, any shape of segmentation can be used, therefore there is no problem of how best to perform the segmentation.

Therefore, it can be considered to use the moment method to simulate the noise current, noise voltage, and intensity of radiation of the electromagnetic field which change over time. Namely, when a wave source changing over time is given, it can be considered to adopt the method of transforming the wave source into a frequency domain, using the moment method to simulate the noise current, noise voltage, and intensity of radiation of the electromagnetic field in the transformed frequency domain, and then performing an inverse Fourier transform to transform it to the time domain.

This method, however, also cannot be realized so long the related art is followed.

This is because if the frequency is given, the moment method is executed by calculating a mutual impedance, mutual admittance, and mutual reaction among mesh-like elements and solving simultaneous equations by using the calculated values, but when transformed from the time domain to frequency domain, they are transformed to a considerable large number of frequencies, and since it is necessary to calculate the mutual impedance etc. for every frequency, an enormous amount of time becomes necessary for the processing.

Figures 8, 9A:
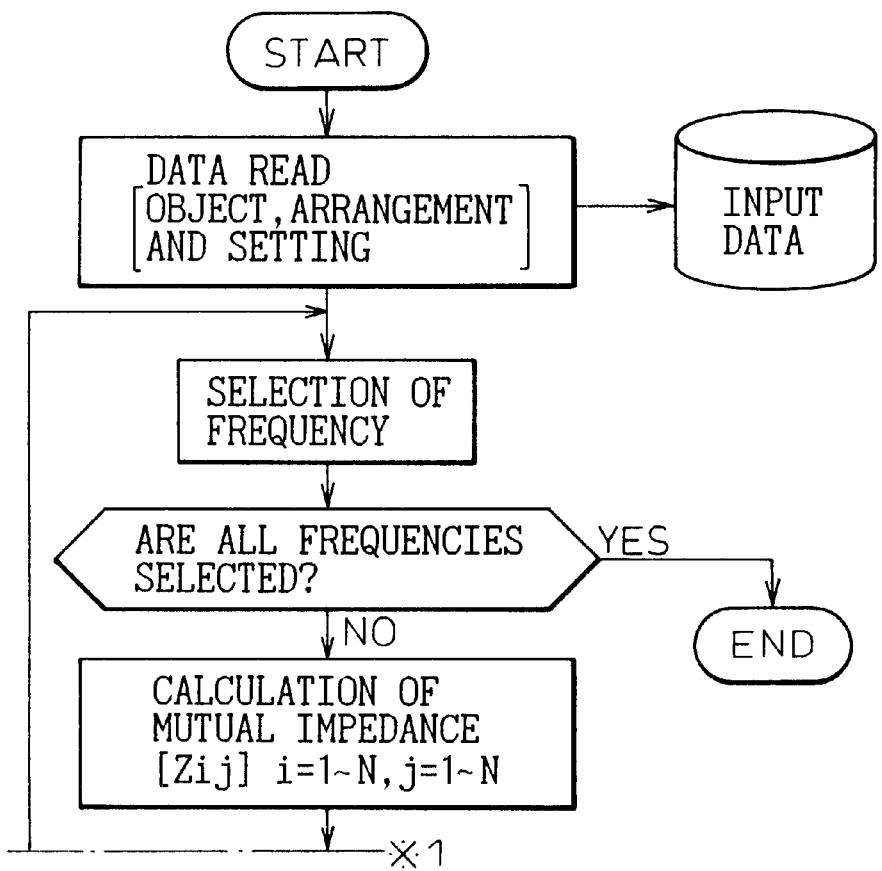
FIG. 8 is an explanatory view of simultaneous equations of the moment method.
FIGS. 9A and 9B are explanatory views of the moment method.
Figure 9B:
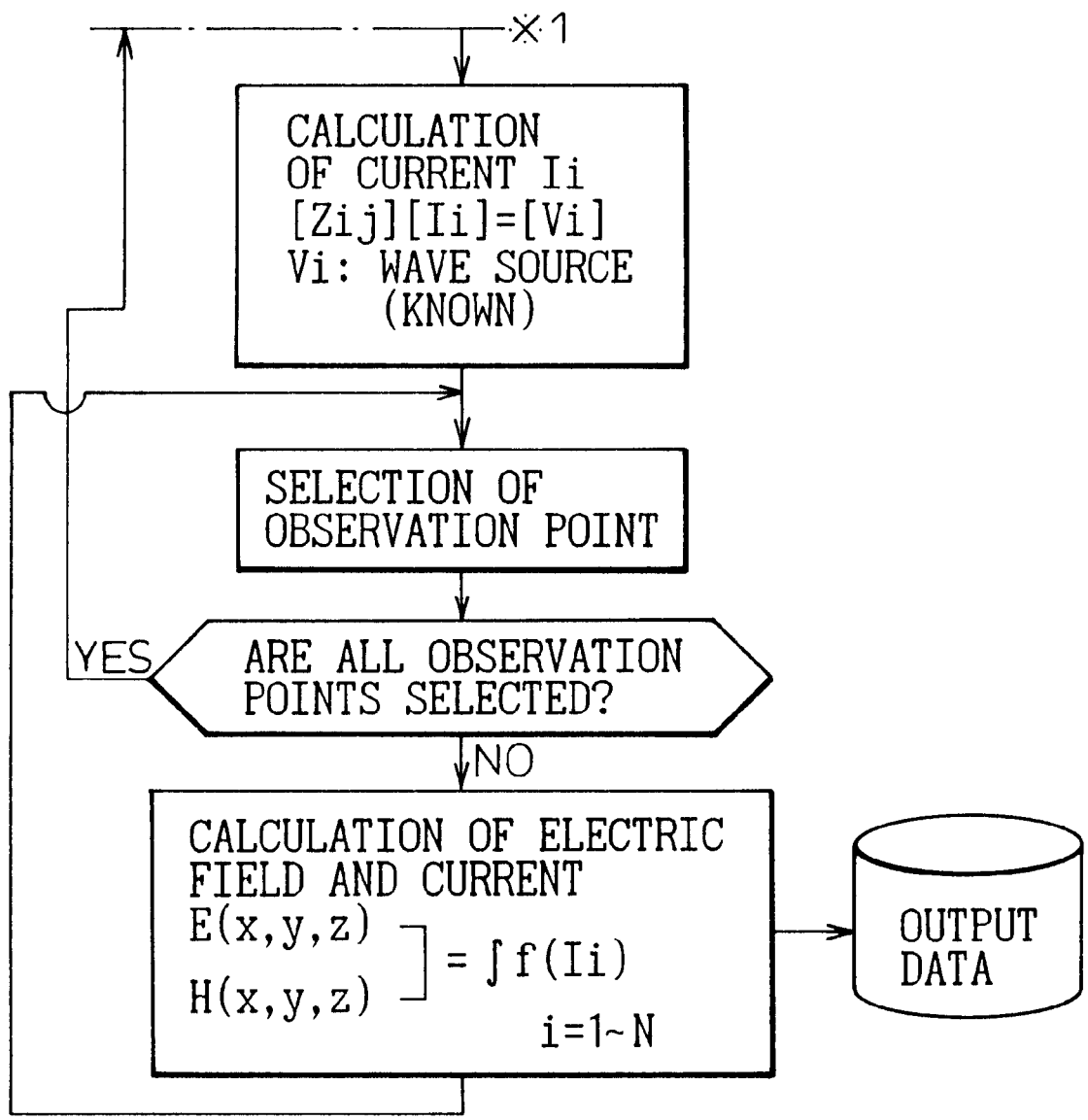

FIGS. 9A and 9B are explanatory views of the moment method. When calculating the intensity of radiation of an electromagnetic field by the moment method, as shown in the flow of processing of FIGS. 9A and 9B, the configuration information of the meshed electronic apparatus to be simulated is read, one unprocessed frequency is selected from among the frequencies to be calculated, the mutual impedance, mutual admittance, and mutual reaction among meshed elements are found for that frequency by a predetermined calculation processing, the found mutual impedance etc. and the wave source specified by the configuration information are substituted into the simultaneous equations of the moment method, the equations are solved to find the electric current and magnetic current flowing through the elements, and the thus found values are used to calculate the intensity of radiation of the electromagnetic field for every observation point. A very long time, however, is taken for the calculation of these mutual impedance, mutual admittance, and mutual reaction and for the solution of the simultaneous equations and, in addition, the above calculation and solution must be achieved for each frequency of frequency domain, therefore there are cases where this process cannot be completed in a practical time.

Note that the mutual impedance represents the relationship between the electric field induced by the current flowing in some element and the current flowing in another element, the mutual admittance represents the relationship between the magnetic field induced by the magnetic current passing through some element and the magnetic current passing through another element, and the mutual reaction represents the relationship between the electric field (magnetic field) induced by the electric current (magnetic current) flowing through some element and the magnetic current (electric current) passing through another element. The electric current flows through metal, while the electric current and magnetic current flow on the surface of a dielectric.

As seen from the above explanation, a practical simulation apparatus for simulating the changing electric current changing over time which flows in an electronic apparatus due to noise or the like and the intensity of the electromagnetic field changing over time which is radiated from an electronic apparatus has not yet been realized to a level enabling the analysis of an apparatus. containing printed boards, cables, and housing.

In order to solve such a problem, the present inventors disclosed in a previously applied Japanese Patent Application No. 9-90412, corresponding to U.S. Ser. No. 08/803,166 and German Pat. Appln. '9710687.0, a system for clarifying why an electronic apparatus radiates undesired radio waves or noise and why an electronic apparatus malfunctions due to radio waves or noise by calculating the mutual impedance, mutual admittance, and mutual reaction at an extremely high speed by using approximation expressions, transforming a given wave source changing over time to the frequency domain, simulating the electric current, magnetic current, and intensity of the electromagnetic field in the transformed frequency domain using the moment method, and inversely transforming the result to the time domain.

In the above invention, if the frequency is represented by f, the wave number is represented by k ($=2\pi f/c$, where c is the speed of light), and the primitive distance between elements is represented by $r_0$, a mutual impedance $Z_{ij}$ between an element i and an element j segmented under the moment method is approximated by a polynomial which is expressed in terms of an exponent and power exponent of a frequency as:

$$Z_{ij}=e^{-jkr_0}[(a_0+a_1f^2+a_2f^4+a_3f^6+a_4f^8+\ldots)+j(b_0f^{-1}+b_1f+b_2f^3+b_3f^5+b_4f^7+\ldots)] \quad (1)$$

a mutual admittance $Y_{ij}$ is approximated by a polynomial which is expressed in terms of an exponent and power exponent of a frequency as:

$$Y_{ij}=e^{-jkr_0}[(a_0+a_1f^2+a_2f^4+a_3f^6+a_4f^8+\ldots)+j(b_0f^{-1}+b_1f+b_2f^3+b_3f^5+b_4f^7+\ldots)] \quad (2)$$

and a mutual reaction $B_{ij}$ is approximated by a polynomial which is expressed in terms of an exponent and power exponent of a frequency as:

$$B_{ij}=e^{-jkr_0}[(a_0+a_1f^2+a_2f^4+a_3f^6+a_4f^8+\ldots)+j(b_0f+b_1f^3+b_2f^5+b_3f^7+b_4f^9+\ldots)] \quad (3)$$

Next, at first, the mutual impedance $Z_{ij}$, the mutual admittance $Y_{ij}$, and the mutual reaction $B_{ij}$ are calculated for several sampling frequencies according to an accurate calculation procedure. These are substituted into the above approximation expressions (1) to (3) to thereby prepare simultaneous equations for finding the coefficients $a_p$ and $b_p$ for these equations. The equations are then solved to find the coefficients $a_p$ and $b_p$. Then, thereafter, when a frequency other than the sampling frequencies is given, the mutual impedance $Z_{ij}$, the mutual admittance $Y_{ij}$, and the mutual reaction $B_{ij}$ are calculated by using the above approximation expressions (1) to (3) defined by the above coefficients $a_p$ and $b_p$, whereby high speed processing of the moment method can be realized.

By using the above invention, the mutual impedance $Z_{ij}$, the mutual admittance $Y_{ij}$, and the mutual reaction $B_{ij}$ can be calculated at an extremely high speed, therefore it becomes possible to execute the moment method at an extremely high speed. Due to this, when a wave source which changes over time is given, it becomes possible to practically use the method of transforming the wave source to the frequency domain and using the moment method to simulate the electric current, voltage, and intensity of radiation of the electromagnetic field in the transformed frequency domain, and inversely transforming them to the time domain.

Due to this, it becomes possible to clarify why an electronic apparatus radiates undesired radio waves or noise and why an electronic apparatus malfunctions due to radio waves or noise.

In the invention disclosed in the previously filed Japanese Patent Application No. 9-90412, the method was adopted of realizing the simulation in the time domain according to the method of performing a Fourier transform, applying the moment method, and performing an inverse Fourier transform on the results of the moment method, but it is possible to realize simulation in the time domain by methods other than this as well.

With this as a background, the present invention provides a novel simulation apparatus and method using the moment method enabling the simulation of the electric current changing over time which flows in an electronic apparatus due to noise etc. and the intensity of an electromagnetic field changing over time which is radiated from an electronic apparatus using above approximation expressions (1) to (3) from a viewpoint different from the above invention disclosed in the previously filed Japanese Patent Application No. 9-90412 and provide a new program memory medium for storing programs for realizing the simulation apparatus therein.

Before entering a detailed explanation of the present invention, an explanation will be made of the derivation of the approximation expressions of the above mutual impedance $Z_{ij}$, the above mutual admittance $Y_{ij}$, and the above mutual reaction $B_{ij}$. These approximation expressions are disclosed in Japanese Patent Application No. 7-298062 previously filed by the present inventors, corresponding the published EP0778533 and U.S. Ser. No. 08/749,679.

Figure 10:
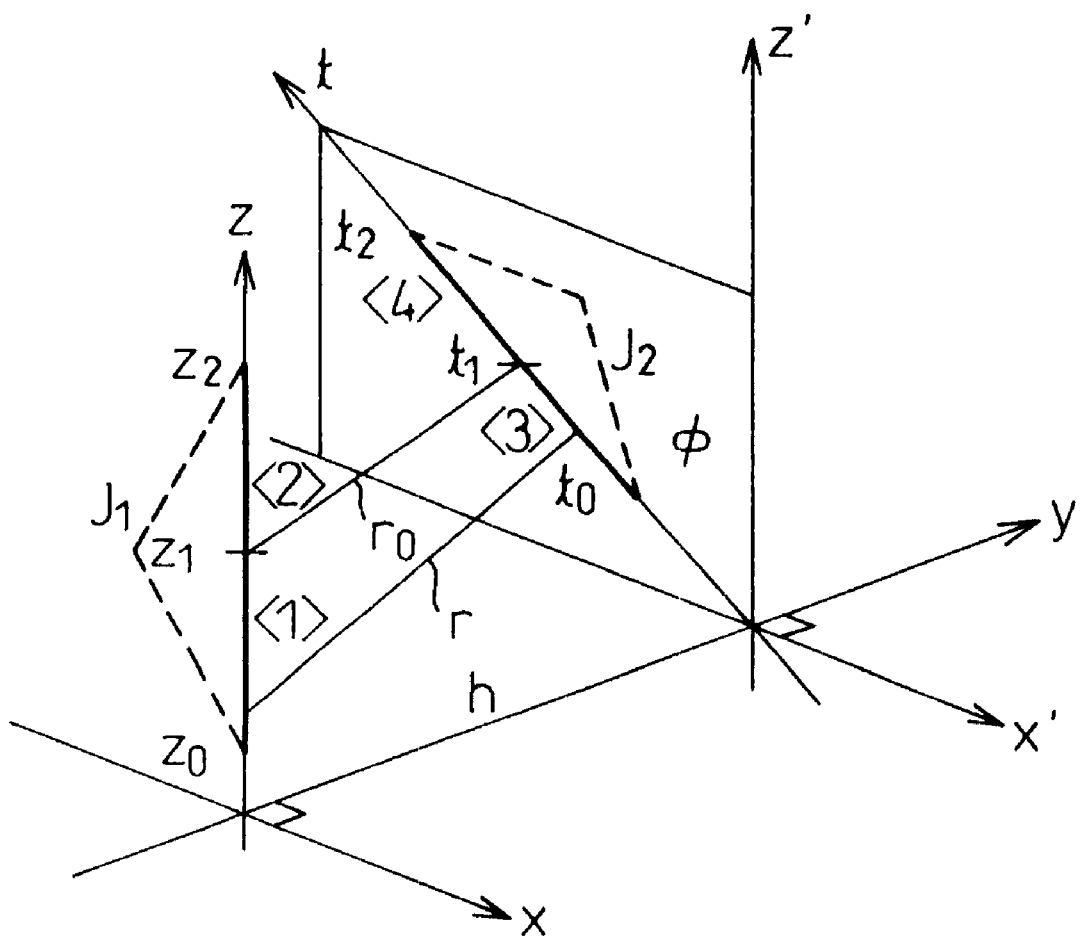
FIG. 10 is an explanatory view for deriving the approximation expression.

FIG. 10 is an explanatory view of the derivation of the approximation expressions.

For explaining the approximation expression of the mutual impedance $Z_{ij}$, consider the monopoles as shown in FIG. 10. In the figure, the bold lines indicate monopoles, while the dotted lines indicate the shape of the expansion functions $J_1$ and $J_2$ explained later. Here, an angle formed between a monopole <1> and a monopole <3> is defined as $\emptyset_1$, and an angle formed between the monopole <1> and a monopole <4> is defined as $\emptyset_2$.

FIGS. 11A and 11B are additional explanatory views of the derivation of the approximation expressions.

The general formula of the mutual impedance $Z_{ij}$ is represented by the equation illustrated in FIG. 11A. Here, $\omega$ is an angular frequency, r is a distance, $\rho_1=(-1/j\omega)\times[\partial J_1/\partial t]$, and $\rho_2=(-1/j\omega)\times[\partial J_2/\partial t]$. Further, the reason for the use of a surface area S (range of integration) is that a case where the shape of the monopole is planar is also considered. Further, $J_1$ and $J_2$ represent an envelop of current flowing on the monopoles. Note that, in FIG. 10, for convenience, the expansion function is represented by a triangular shape by the dotted line, but the expansion function in the following explanation is a piecewise-sinusoidal function current.

In the segmented piecewise-sinusoidal moment method, the expansion functions of the monopoles <1> to <4> of FIG. 10 can be represented as follows. Here, $d_1$ is the length of the monopole <1>, $d_2$ is the length of the monopole <2>, $d_3$ is the length of the monopole <3>, and $d_4$ is the length of the monopole <4>.

Electric current monopole <1> $J_1=\sin k(z-z_0)/\sin kd_1$

Electric current monopole <2> $J_1=\sin k(z_2-z)/\sin kd_2$

Electric current monopole <3> $J_2=\sin k(t-t_0)/\sin kd_3$

Electric current monopole <4> $J_2=\sin k(t_2-t)/\sin kd_4$ \quad (4)

Using these expansion functions, first a mutual impedance $Z_{13}$ between the monopole <1> and the monopole <3> and a mutual impedance $Z_{14}$ between the monopole <1> and the monopole <4> are found. These mutual impedances $Z_{13}$ and $Z_{14}$ are represented by the equations shown in FIG. 11B.

FIGS. 12A and 12B are additional explanatory views of the derivation of approximation expressions.

Here, when taking a distance $r=(z^2+t^2-2zt \cos \emptyset +h^2)^{1/2}$ between monopoles into account, the coefficient parts of these mutual impedances $Z_{13}$ and $Z_{14}$ are represented as the equations shown in FIG. 12A. Note that, $\alpha=c\mu/4\pi$.

Further, if the distance between an end point of one monopole and the end point of another monopole is represented by $r_0$, the distance r between monopoles is:

$$r=r_0+d$$

where, $$r_0=(z_1^2+t_1^2-2z_1 t_1 \cos \emptyset +h^2)^{1/2} \qquad (5)$$

Further, if the length d of each monopole is sufficiently small compared to a wavelength $\lambda$, it becomes:

$$d=r-r_0<<\lambda \qquad (6)$$

From the above, the mutual impedances $Z_{13}$ and $Z_{14}$ are represented by the equations as shown in FIG. 12B. Here, $A_1=\sin kd_1 \sin kd_3$.

In order to simplify the format of these equations, the following are defined: $z-z_0=u$, $t-t_0=v$ and $w=-t+t_2$. Further, assuming that the monopole is short, if the polynomial approximations of:

$$\sin ku \approx ku-(ku)^3/6 \quad \cos ku \approx 1-(ku)^2/2 \qquad (7)$$

are carried out, a real part $R_1$ of the mutual impedance $Z_{13}$ is converted as the equation shown in FIG. 13 and finally represented as the equation shown in FIG. 14. Note that, the notation is omitted for $e^{-jkr0}$.

Here, when rewriting the coefficients of terms such as $k^4$ and others as $P_1$ to $P_8$, this equation may be represented as:

$$R_1=[\alpha/A_1][(P_1k^4-P_2k^6+P_3k^8-P_4k^{10})\cos \emptyset_1-P_5k^2+P_6k^4-P_7k^6+P_8k^8] \qquad (8)$$

Further, if using the approximation expression $[A_1=\sin kd_1 \sin kd_3 \approx d_1d_3k^2]$ and inserting the $e^{-jkr0}$ omitted in the notation, the real part $R_1$ of the mutual impedance $Z_{13}$ may be represented as:

$$R_1=[\alpha e^{-jkr0}/(d_1d_3k^2)][(P_1k^4-P_2k^6+P_3k^8-P_4k^{10})\cos \emptyset_1-P_5k^2+P_6k^4-P_7k^6+P_8k^8]$$

$$=[\alpha e^{-jkr0}/(d_1d_3)][(P_1k^2-P_2k^4+P_3k^6-P_4k^8)\cos \emptyset_1-P_5+P_6k^2-P_7k^4+P_8k^6] \qquad (9)$$

On the other hand, an imaginary part $I_1$ of the mutual impedance $Z_{13}$ is represented as the equation shown in FIG. 15. From this, finally, it is represented as the equation shown in FIG. 16. Note that the notation is omitted for $e^{-jkr0}$.

Here, if rewriting the coefficients of terms such as $k^3$ and others to $Q_1$ to $Q_8$, this equation may be represented as:

$$I_1=[\alpha/A_1][(Q_1k^3-Q_2k^5+Q_3k^7-Q_4k^9)\cos \emptyset_1-Q_5k+Q_6k^3-Q_7k^5+Q_8k^7] \qquad (10)$$

Further, if using the approximation expression $[A_1=\sin kd_1 \sin kd_2 \approx d_1d_2k^2]$ and inserting the $e^{-jkr0}$ omitted in the notation, the imaginary part $I_1$ of the mutual impedance $Z_{13}$ may be represented as:

$$I_1=[\alpha e^{-jkr0}/(d_1d_2k^2)][(Q_1k^3-Q_2k^5+Q_3k^7-Q_4k^9) \cos \emptyset_1-Q_5k+Q_6k^3-Q_7k^5+Q_8k^7]$$

$$=[\alpha e^{-jkr0}/(d_1d_3)][(Q_1k-Q_2k^3+Q_3k^5-Q_4k^7) \cos \emptyset_1-Q_5/k+Q_6k-Q_7k^3+Q_8k^5] \qquad (11)$$

From this, the mutual impedance $Z_{13}$ may be represented as:

$$Z_{13}=R_1+jI_1=[\alpha e^{-jkr0}/(d_1d_3)][(P_1k^2-P_2k^4+P_3k^6-P_4k^8) \cos \emptyset_1-P_5+P_6k^2-P_7k^4+P_8k^6]$$

$$+j[\alpha e^{-jkr0}/(d_1d_3)][(Q_1k-Q_2k^3+Q_3k^5-Q_4k^7)\cos \emptyset_1-Q_5/k+Q_6k-Q_7k^3+Q_8k^5] \qquad (12)$$

The mutual impedance $Z_{14}$ can also be found in the same way. The mutual impedance $Z_{14}$ is shown below:

$$Z_{14}=[\alpha e^{-jkr0}/(d_1d_3)][(R_1k^2-R_2k^4+R_3k^6-R_4k^8)\cos \emptyset_1-R_5+R_6k^2-R_7k^4+R_8k^6]$$

$$+j[\alpha e^{-jkr0}/(d_1d_4)][(S_1k-S_2k^3+S_3k^5-S_4k^7)\cos \emptyset_2-S_5/k+S_6k-S_7k^3+S_8k^5] \qquad (13)$$

In this way, a mutual impedance $(Z_{13}+Z_{14})$ can be represented by the polynomial of a wave number k as shown below:

$$Z_{13}+Z_{14}=e^{-jkr0}[(C_0+C_1k^2+C_2k^4+C_3k^6+C_4k^8+\ldots)+j(C_5k^{-1}+C_6k+C_7k^3+C_8k^5+C_9k^7+\ldots)] \qquad (14)$$

When representing the mutual impedance between the monopole <2> and the monopole <3> as $Z_{23}$ and the mutual impedance between the monopole <2> and the monopole <4> as $Z_{24}$, the mutual impedance $(Z_{23}+Z_{24})$ can be similarly found. Accordingly, a mutual impedance $(Z_{13}+Z_{14}+Z_{23}+Z_{24})$ can be represented by the polynomial of the wave number k in the same way as the above equations.

Namely, the mutual impedance $Z_{ij}$ can be approximated by:

$$Z_{ij}=e^{-jkr0}[(a_0+a_1f^2+a_2f^4+a_3f^6+a_4f^8+\ldots)+j(b_0f^{-1}+b_1f+b_2f^3+b_3f^5+b_4f^7+\ldots)] \qquad (15)$$

It can be proved that the mutual admittance $Y_{ij}$ can be approximated by a polynomial of the frequency in the same way as the mutual impedance $Z_{ij}$. Also, the approximation expression thereof is exactly the same as the approximation expression of the mutual impedance $Z_{ij}$, so the proof thereof will be omitted.

Namely, the mutual admittance $Y_{ij}$ can be approximated as:

$$Y_{ij}=e^{-jkr0}[(a_0+a_1f^2+a_2f^4+a_3f^6+a_4f^8+\ldots)+j(b_0f^{-1}+b_1f+b_2f^3+b_3f^5+b_4f^7+\ldots)] \qquad (16)$$

Next, an explanation will be made of the fact that the mutual reaction $B_{ij}$ can be approximated by a polynomial of the frequency.

Figure 17:
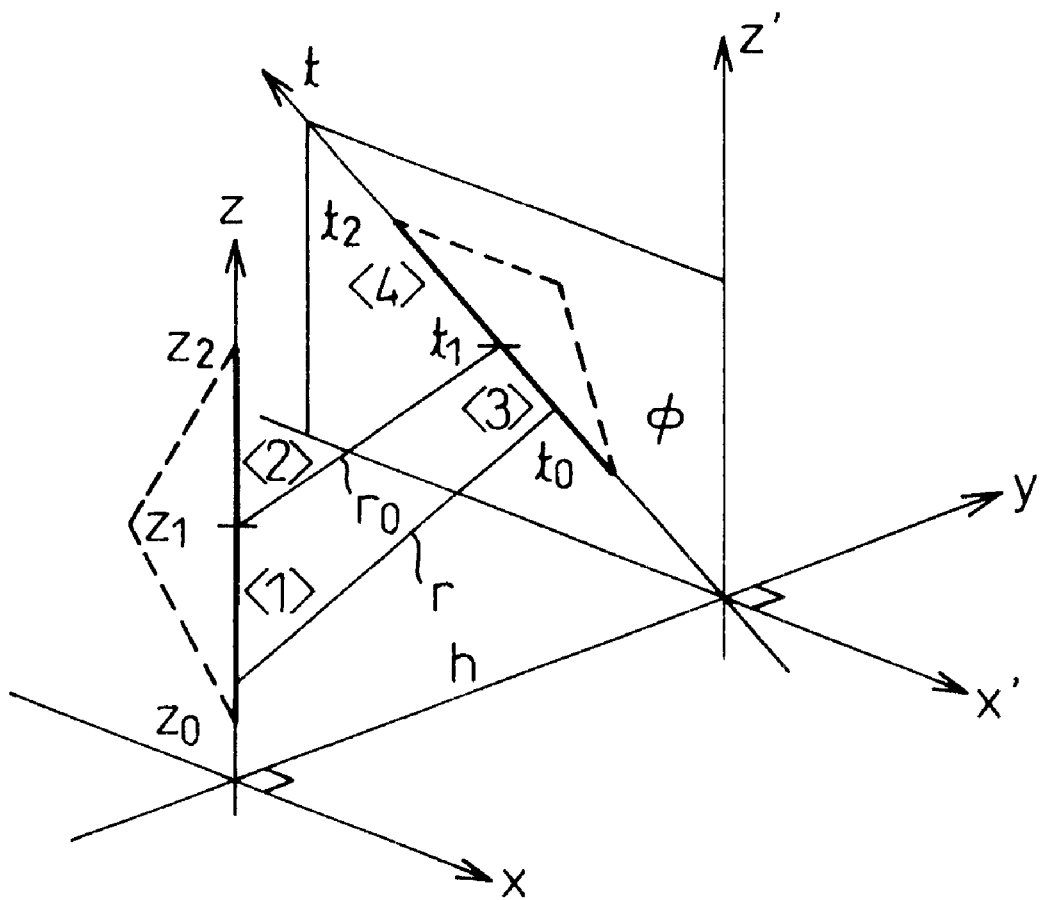

FIG. 17 is another explanatory view of the derivation of the approximation expression. In order to explain the approximation expression of the mutual reaction $B_{ij}$, consider the monopole as illustrated in FIG. 17. In the figure, the bold lines indicate monopoles, while the dotted lines indicate the shape of the expansion function.

FIGS. 18A, 18B, and 18C are further explanatory views of the derivation of approximation expressions. Consider a magnetic field due to a current source. Here, a unit vector can be represented as shown in FIG. 18A.

In the segmented piecewise-sinusoidal moment method, the expansion functions of the monopoles <1> to <4> of FIG. 17 can be represented as follows. Here, $d_1$ is the length of the monopole <1>, $d_2$ is the length of the monopole <2>, $d_3$ is the length of the monopole <3>, and $d_4$ is the length of the monopole <4>.

Electric current monopole <1> $J_1=\sin k(z-z_0)/\sin kd_1$

Electric current monopole <2> $J_2=\sin k(z_2-z)/\sin kd_2$

Magnetic current monopole <3> $M_3 = \sin k(t-t_0)/\sin kd_3$

Magnetic current monopole <4> $M_4 = \sin k(t_2-t)/\sin kd_4$ (17)

When the current source is only on the Z-coordinate, the electromagnetic field becomes circularly symmetric (irrespective of the Ø-coordinate) and only HØ exists. This HØ may be represented by the equation shown in FIG. 18B.

In FIG. 17, the magnetic field component of a wire #2 in the tangential direction is represented by $Ht=(-h/\rho) \times H\emptyset \sin \emptyset$, therefore the mutual reaction $B_{ij}$ is represented as the equation shown in FIG. 18C.

FIGS. 19 to 25 are other explanatory views of the derivation of the approximation expression. If the condition shown in FIG. 19 is substituted into this equation of FIG. 8C, the mutual reaction $B_{ij}$ may be represented as the equation shown in FIG. 20A.

Further, the distance r between monopoles can be expressed by:

$$r = (z^2 + t^2 - 2zt \cos \emptyset + h^2)^{1/2} = r_0 + d \quad (18)$$

as mentioned above. Further, if the length d of each monopole is sufficiently small relative to the wavelength λ, it becomes:

$$d = r - r_0 \ll \lambda \quad (19)$$

so the mutual reaction $B_{ij}$ can be expressed by the equation shown in FIG. 20B.

From the above, the mutual reaction $B_{13}$ between the monopole <1> and the monopole <3> and the mutual reaction $B_{14}$ between the monopole <1> and the monopole <4> may be expressed as the equations shown in FIG. 21.

To simplify these equations in format, assume that $z-z_0 = u$, $t-t_0 = v$, and $w = -t + t_2$. Further, assuming that the monopole is short, if the polynomial approximations:

$$\sin ku \approx ku - (ku)^3/6 \quad \cos ku \approx 1 - (ku)^2/2 \quad (20)$$

are carried out, the second term on the right side of the mutual reaction $B_{13}$ is converted as the equation shown in FIG. 22 and finally represented as the equation shown in FIG. 23.

Here, if rewriting the coefficients of terms such as $k^2$ and others to $P_1$ to $P_8$, this equation may be represented as:

$$P_1 k^2 + P_2 k^4 + P_3 k^6 + P_4 k^8 + j(P_5 k^3 + P_6 k^5 + P_7 k^7 + P_8 k^9) \quad (21)$$

Similarly, the first term on the right side of the mutual reaction $B_{13}$ may be converted to the equation shown in FIG. 24 and be finally represented as the equation as shown in FIG. 25.

Here, if rewriting the coefficients of terms such as $k_2$ and others to $Q_1$ to $Q_8$, this equation may be represented as:

$$Q_1 k^4 + Q_2 k^6 + Q_3 k^8 + Q_4 k^{10} + j(Q_5 k^3 + Q_6 k^5 + Q_7 k^7 + Q_8 k^9) \quad (22)$$

From this, the mutual reaction $B_{13}$ may be represented as:

$B_{13} = [h_1 \sin \emptyset_1/(4\pi \sin$ $kd_1 \sin kd_3)] e^{-jkr0} x[$ $P_1 k^2 + P_2 k^4 + P_3 k^6$ $+ P_4 k^8 + j(P_5 k^3$ $+ P_6 k^5 + P_7 k^7 P_8$ $k^9) + Q_1 k^4 + Q_2 k^6$ $+ Q_3 k^8 + Q_4 k^{10} + j$ $(Q_5 k^3 + Q_6 k^5 + Q_7 k^7$ $+ Q_8 k^9)]$ (23)

Further, if using the approximation expression "$\sin kd_1 \sin kd_3 \approx d_1 d_3 k^2$", the mutual reaction $B_{13}$ may be represented as:

$B_{13} = [h_1 \sin \emptyset_1/(4$ $\pi d_1 d_3)] e^{-jkr0} x[P_1$ $+ (P_2 + Q_1) k^2$ $+ (P_3 + Q_2) k^4 +$ $(P_4 + Q_3) k^6 + Q_4 k^8$ $+ j[(P_5 + Q_5) k$ $+ (P_6 + Q_6) k^3$ $+ (P_7 + Q_7) k^5$ $+ (P_8 + Q_8) k^7]]$ $= e^{-jkr0} [R_1 + R_2 k^2 + R_3 k^4 + R_4 k^6 + R_5 k^8 + j(R_6 k + R_7 k^3 + R_8 k^5 + R_9 k^7)$ (24)

The mutual reaction $B_{14}$ can be similarly found. The mutual reaction $B_{14}$ is shown below:

$$B_{14} = e^{-jkr0}[S_1 + S_2 k^2 + S_3 k^4 + S_4 k^6 + S_5 k^8 + j(S_6 k + S_7 k^3 + S_8 k^5 + S_9 k^7)] \quad (25)$$

In this way, a mutual reaction $(B_{13} + B_{14})$ can be represented by the polynomial of the wave number k as shown below.

$$B_{13} + B_{14} = e^{-jkr0}[C_1 + C_2 k^2 + C_3 k^4 + C_4 k^6 + C_5 k^8 + j(C_6 k + C_7 k^3 + C_8 k + C_9 k^7)] \quad (26)$$

If the mutual reaction between the monopole <2> and the monopole <3> is represented by $B_{23}$ and the mutual reaction between the monopole <2> and the monopole <4> is represented by $B_{24}$, the mutual reaction $(B_{23} + B_{24})$ can be similarly found. Accordingly, also a mutual reaction $(B_{13} + B_{14} + B_{23} + B_{24})$ can be expressed by a polynomial of the wave number k in the same way as the above equation.

Namely, the mutual reaction $B_{ij}$ can be approximated as:

$$B_{ij} = e^{-jkr0}[(a_0 + a_1 f^2 + a_2 f^4 + a_3 f^6 + a_4 f^8 + \ldots) + j(b_0 f + b_1 f^3 + b_2 f^5 + b_3 f^7 + b_4 f^9 + \ldots)] \quad (27)$$

In this way, the mutual impedance $Z_{ij}$ between the element i and the element j can be approximated by a polynomial of the power exponents of the frequency such as:

$$Z_{ij} = e^{-jkr0}[(a_0 + a_1 f^2 + a_2 f^4 + a_3 f^6 + a_4 f^8 + \ldots) + j(b_0 f^{-1} + b_1 f + b_2 f^3 + b_3 f^5 + b_4 f^7 + \ldots)] \quad (28)$$

the mutual admittance $Y_{ij}$ can be approximated by a polynomial of the power exponents of the frequency such as:

$$Y_{ij} = e^{-jkr0}[(a_0 + a_1 f^2 + a_2 f^4 + a_3 f^6 + a_4 f^8 + \ldots) + j(b_0 f^{-1} + b_1 f + b_2 f^3 + b_3 f^5 + b_4 f^7 + \ldots)] \quad (29)$$

and the mutual reaction $B_{ij}$ can be approximated by a polynomial of the power exponents of the frequency such as:

$$B_{ij} = e^{-jkr0}[(a_0 + a_1 f^2 + a_2 f^4 + a_3 f^6 + a_4 f^8 + \ldots) + j(b_0 f + b_1 f^3 + b_2 f^5 + b_3 f^7 + b_4 f^9 + \ldots)] \quad (30)$$

As explained above, the present invention provides a novel simulation apparatus and method using the moment method making it possible to simulate the electric current changing over time flowing in an electronic apparatus due to noise or the like and the intensity of the electromagnetic field changing over time which is radiated from the electronic apparatus while using approximation expressions and provides a memory medium storing a program for realizing the simulation apparatus therein.

The basic structure of the present invention is illustrated in FIG. 1.

In the figure, 1 is a simulation apparatus based on the present invention which simulates the electric current changing over time which flows in an electronic apparatus due to noise or the like and the intensity of the electromagnetic field changing over time which is radiated from an electronic apparatus. Reference numeral 2 is a configuration data file which stores the configuration information of the electronic apparatus to be processed by the simulation apparatus 1. Reference numeral 3 is an output data file which stores the simulation result calculated by the simulation apparatus 1.

The simulation apparatus 1 of the present invention is provided with an input means 10, a segmenting means 11, a calculating means 12, a setting means 13, a computing means 14, a work memory 15, an erasing means 16, a second computing means 17, and an output means 18.

This input means 10 receives as its input the configuration information of the electronic apparatus to be simulated, which information is stored in the configuration data file 2. The segmenting means 11 segments the configuration information of the electronic apparatus input to the input means 10 into elements.

When not taking into account a dielectric possessed by the electronic apparatus, the calculating means 12 calculates the mutual impedance between elements at the sampling frequency and calculates the approximation coefficients, when expressing the mutual impedance by an approximation expression in terms of the exponent and power exponent, from the calculated value and the sampling frequency. On the other hand, when taking the dielectric possessed by the electronic apparatus into account, it calculates the mutual impedance, the mutual admittance, and the mutual reaction between elements at the sampling frequency and calculates the approximation coefficients, when expressing the mutual impedance, mutual admittance, and mutual reaction by approximation expressions in terms of exponents and power exponents, from these calculated values and sampling frequency.

The setting means 13 is for forming simultaneous differential equations by setting the approximation coefficients calculated by the calculating means 12 and the initial value for the simultaneous differential equations derived by performing Fourier transform on the simultaneous equations of the moment method into which the approximation expression derived by the calculating means 12 has been substituted.

When not taking into account the dielectric possessed by the electronic apparatus, the computing means 14 solves the simultaneous differential equations formed by the setting means 13 to calculate the electric current of the time domain flowing in the specified element or calculate related values of the time domain making the derivation of the electric current possible and calculate the electric current from related values. On the other hand, when taking into account the dielectric possessed by the electronic apparatus, it solves simultaneous differential equations formed by the setting means 13 to calculate the electric current and magnetic current of the time domain flowing through the specified element or calculate related values of the time domain making the derivation of the electric current and magnetic current possible and calculate the electric current and magnetic current from the related values.

The work memory 15 stores the set values set by the setting means 13 and calculated values calculated by the computing means 14. The erasing means 16 erases undesired data stored in the work memory 15.

When not taking into account the dielectric possessed by the electronic apparatus, the second computing means 17 calculates one or both of the electric field and magnetic field of the time domain produced at the observation point by using the electric currents, calculated by the computing means 14, flowing in the elements. On the other hand, when taking into account the dielectric possessed by the electronic apparatus, it calculates one or both of the electric field and magnetic field of the time domain produced at the observation point by using the electric currents and magnetic currents flowing through elements calculated by the computing means 14.

The output means 18 outputs the result of calculation calculated by the computing means 14 and the result of calculation calculated by the second computing means 17 to the output data file 3.

Here, the functions provided by the simulation apparatus 1 of the present invention are practically realized by a program. The program is stored in a floppy disk etc. or is stored in a disk etc. of a server. The program is installed in the simulation apparatus 1 from these disks and operates on the memory, whereby the present invention is realized.

In the simulation apparatus 1 of the present invention constituted in this way, when not taking into account the dielectric possessed by the electronic apparatus, the calculating means 12 calculates the mutual impedance between elements at the sampling frequency and calculates the approximation coefficients, when expressing the mutual impedance by the approximation expression in terms of an exponent and power exponent of angular frequency, from the above calculated values and the sampling frequency.

For example, the approximation coefficient $a_{mn}$ (including also m=n) when approximating the mutual impedance $Z_{mn}$ between an element m and an element n as:

$$Z_{mn} = \exp[-j\omega r_{mn}/c] \cdot [a_{mn0} - a_{mn2}(j\omega)^2 + a_{mn4}(j\omega)^4 - a_{mn6}(j\omega)^6 \ldots \\ -a_{mn-1}/(j\omega) + a_{mn-1}/(j\omega) + a_{mn3}(j\omega)^3 + a_{mn5}(j\omega)^5 \ldots] \qquad (31)$$

where, $\omega$: angular frequency, c: speed of light, $r_{mn}$: distance between the elements m and n, $a_{mx}$: approximation coefficient (x indicates the order of $\omega$) is calculated.

Based on the result of calculation processing of this calculating means 12, the setting means 13 forms simultaneous differential equations by setting the approximation coefficients calculated by the calculating means 12 and the initial value for the simultaneous differential equations derived by performing a Fourier transform on the simultaneous equations of the moment method into which the above approximation expression is substituted.

If performing a Fourier transform on the simultaneous equations of the moment method into which the approximation expression of the mutual impedance $Z_{mn}$ is substituted, when the number of elements is N, the following simultaneous differential equations are obtained:

$$[-a_{mm-1}q_m(t) + a_{mm0}q_m^1(t) + a_{mm1}q_m^2(t) - a_{mm2}q_m^3(t) - a_{mm3}q_m^4(t) + a_{mm4}q_m^5(t) \ldots]$$

$$= v_m(t) + \Sigma^*[a_{mn-1}q_n$$

$$(t - r_{mn}/c) - a_{mn0}q_n^1$$

$$(t - r_{mn}/c) - a_{mn1}q_n^2$$

$$(t - r_{mn}/c) + a_{mn2}q_n^3$$

$$(t - r_{mn}/c) + a_{mn3}q_n^4$$

$$(t-r_{mn}/c)-a_{mn4}q_n^5$$

$$(t-r_{mn}/c)\ldots] \tag{32}$$

where, m=1 to N, $v_m(t)$: wave source possessed by element m, $\Sigma^*$: summation for "n=1 to N" except for "n=m", $q_m(t)$: charge corresponding to electric current $i_m(t)$ ($i_m=[d/dt]q_m$), $q_m^n(t)$: nth differential of $q_m(t)$.

The setting means 13 sets the approximation coefficient $a_{nm}$ (including also m=n) calculated by the calculating means 12 and the initial value of "$q_n^y(t)$ (y=0, 1, 2 ...)" for these simultaneous differential equations to thereby form these simultaneous differential equations.

Based on the result of the processing of this setting means 13, the computing means 14 solves the above simultaneous differential equations to thereby find "$q_m(t)$, $q_m^1(t)$, $q_m^2(t)$ ...". By this, it calculates the electric current ($q_m^1(t)$) of the time domain flowing in a specified element or calculates the related values ($q_m(t)$, $q_m^2(t)$, etc.) of the time domain making it possible to derive the electric current of the time domain flowing in a specified element and calculates the electric current from these values.

Then, based on the result of calculation of this computing means 14, the second computing means 17 calculates the electric field and magnetic field of the time domain produced at the observation point according to the known electromagnetic theoretical equations by using the electric currents flowing in the elements calculated by the computing means 14.

At this processing, the computing means 14 stores the calculated values in the work memory 15 and refers to the past calculated values stored in the work memory 15 at the calculation at the next time step, but the erasing means 16 performs the processing for reducing the required memory capacity of the work memory 15 by erasing data which becomes unnecessary due to the elapse of a propagation time of $r_m(max)$ (maximum value of r) among "$q_n(t-r_{mn}/c)$, $q_n^1(t-r_{mn}/c)$ ..." of the past data to be stored in the work memory 15 which becomes necessary for solving "$q_m(t)$, $q_m^1(t)$ ...".

In this way, according to the simulation apparatus 1 of the present invention, it becomes possible to simulate the temporally changing electric current changing over time which flows in an electronic apparatus due to noise or the like and the intensity of the electromagnetic field changing over time which is radiated from an electronic apparatus. By this, it becomes possible to solve why an electronic apparatus radiates undesired radio waves or noise and why an electronic apparatus malfunctions due to radio waves or noise.

Below, the present invention will be explained in further detail according to embodiments.

Figures 2, 3:
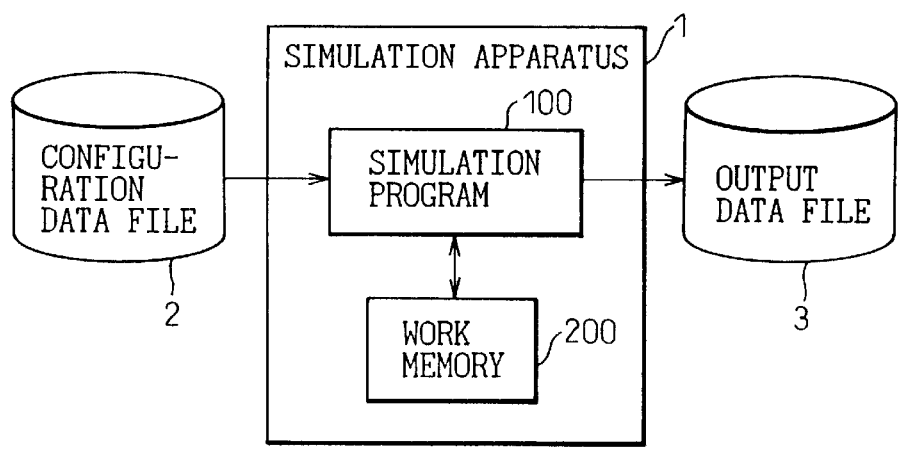
FIG. 2 is a view of an embodiment of the present invention.
FIG. 3 is an explanatory view of simultaneous equations of a moment method.
Figure 4A:
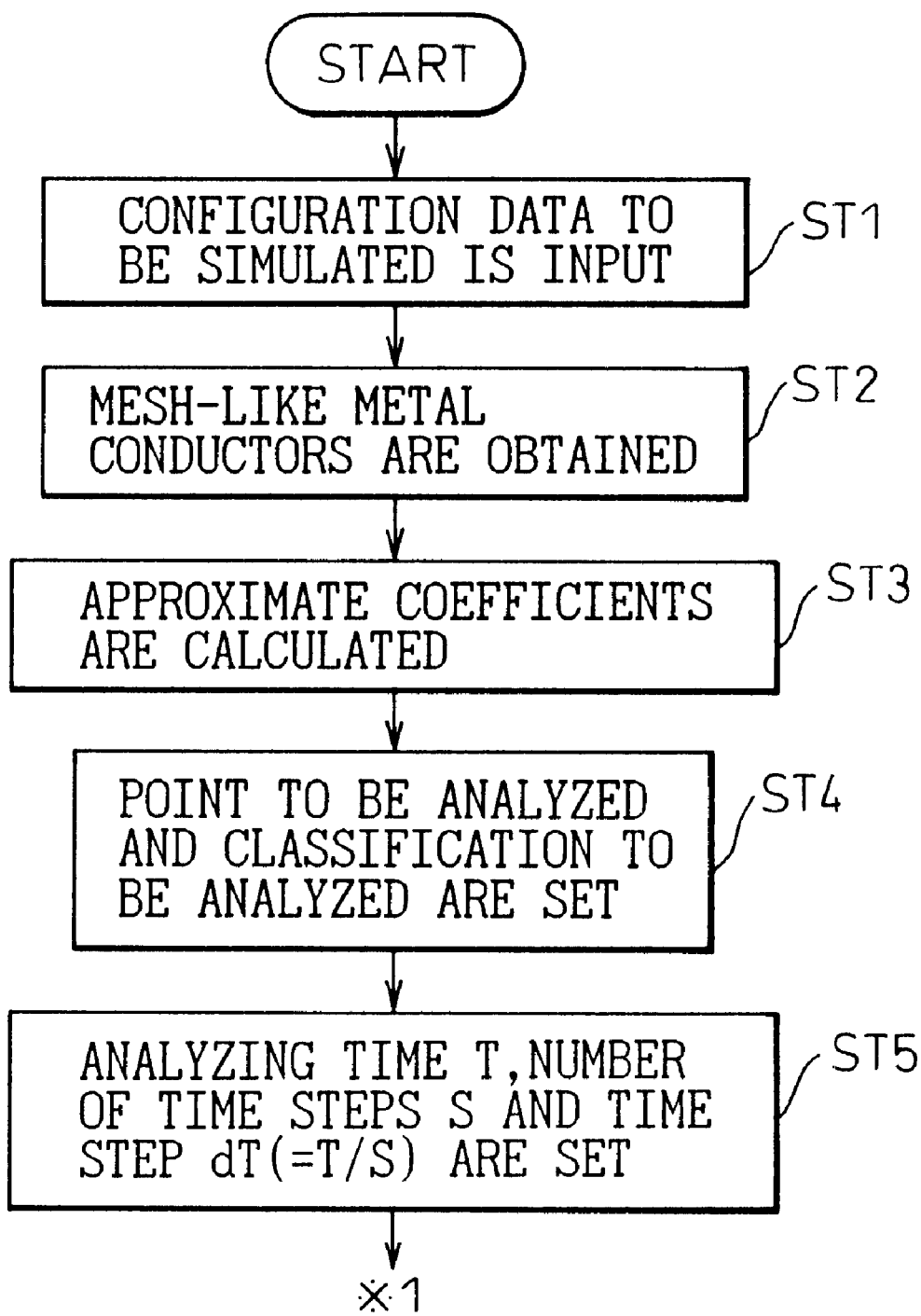
FIGS. 4A and 4B are flow charts of processings executed by simulation programs.
Figure 4B:
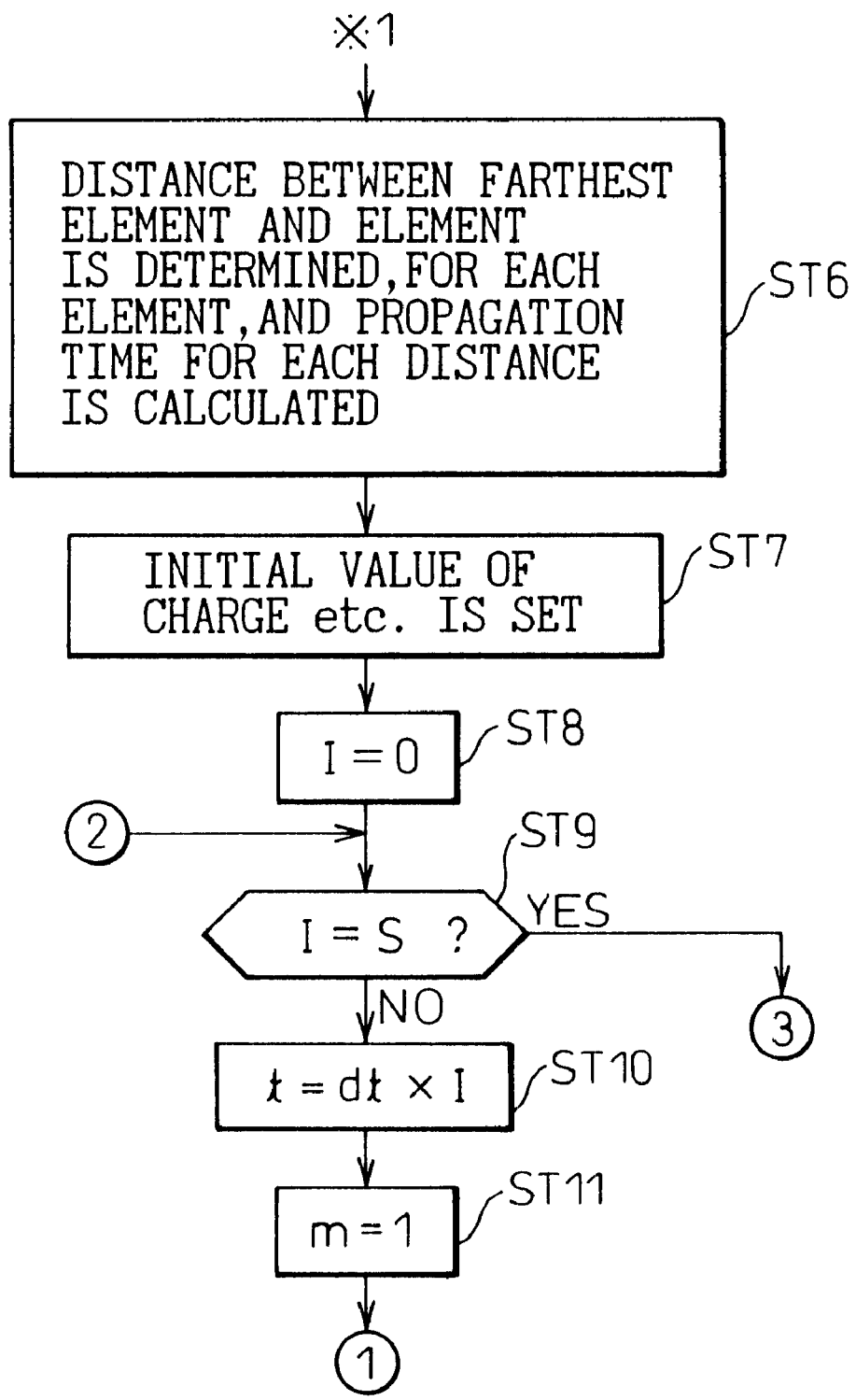
Figure 5A:
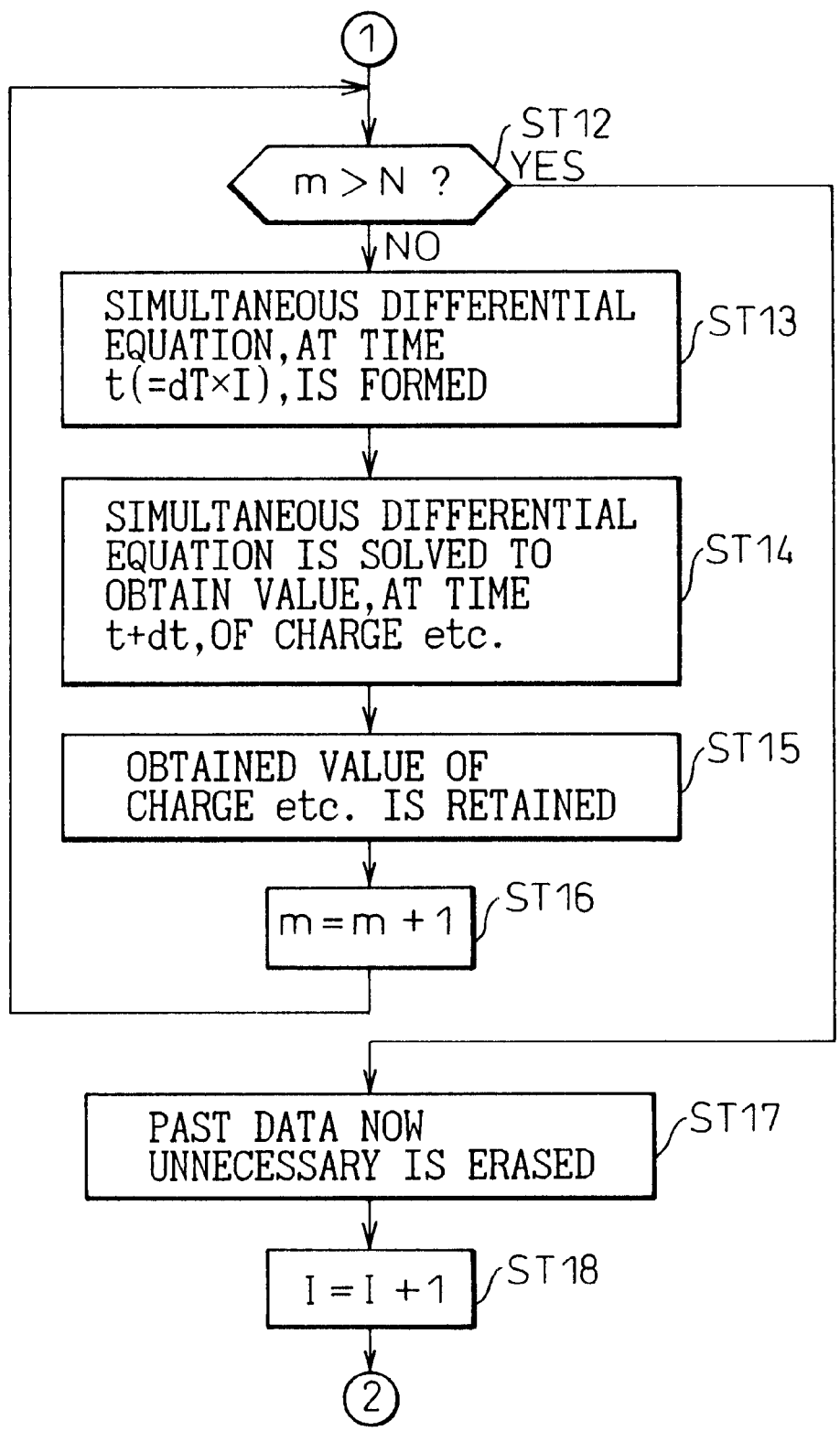
FIGS. 5A and 5B are flow charts of processings executed by the simulation programs.
Figure 5B:
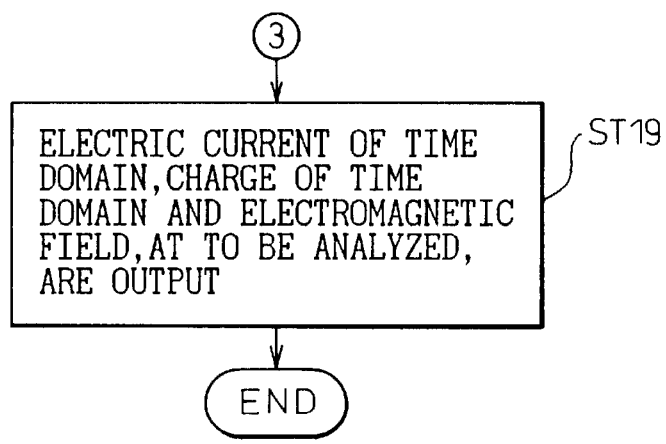

FIG. 2 shows an embodiment of the simulation apparatus 1 based on the present invention.

The simulation apparatus 1 based on the present invention performs processing for running a simulation program 100 installed via a floppy disk or communications line, reading the configuration information of the electronic apparatus to be simulated from the configuration data file 2 by using this simulation program 100, segmenting this into elements, simulating the electric current and magnetic current flowing through the elements by using the moment method while utilizing a work memory 200 and also simulating the electric field and magnetic field at the observation point by using the simulated electric current and magnetic current, and storing the result of the simulation in the output data file 3.

First, an explanation will be made of the simultaneous differential equations for the electric current of the time domain to be solved by the simulation program 100.

As mentioned above, the mutual impedance $Z_{ij}$ between the segmented elements i and j can be approximated as:

$$Z_{ij}=e^{-jkr_0}[(a_0+a_1f^2+a_2f^4+a_3f^6+a_4f^8+\ldots)+j(b_0f^{-1}+b_1f+b_2f^3+b_3f^5+b_4f^7+\ldots)] \tag{33}$$

If this approximation expression is modified according to $f=\omega/2\pi$ and $k=2\pi f/c$ and suffixes of the approximation coefficients are rewritten to a format where the exponent power values and individual elements can be seen, the result becomes:

$$Z_{ij}=\exp[-j\omega r_{ij}/c]\times[(a_{ij0}+a_{ij2}\omega^2 a_{ij4}\omega^4+a_{ij6}\omega^6+\ldots)+j(a_{ij-1}\omega^{-1}+a_{ij1}\omega+a_{ij3}\omega^3+a_{ij5}\omega^5+\ldots)] \tag{34}$$

Further modifying this, the result becomes:

$$Z_{ij}=\exp[-j\omega r_{ij}/c]\times[(a_{ij1}-a_{ij2}\omega^2+a_{ij4}\omega^4-a_{ij6}\omega^6+\ldots-a_{ij-1}/(j\omega)+a_{ij1}(j\omega)-a_{ij3}(j\omega)^3+a_{ij5}(j\omega)^5\ldots] \tag{35}$$

FIG. 3 is a view explaining the simultaneous equations of the moment method.

According to the moment method, the simultaneous equations shown in FIG. 3 stand with respect to the segmented elements.

In these simultaneous equations, the mth equation can be represented as:

$$Z_{m1}I_1+Z_{m2}I_2+Z_{m3}I_3+\ldots+Z_{mN}I_N=V_m \tag{36}$$

Here, $I_p$ is the electric current flowing in the element p (p=1 to N), and $V_m$ is the wave source applied to the element m. Note that more precisely described, $I_p$ is "$I_p(\omega)\exp(j\omega t)$", and more precisely described, $V_m$ is "$V_m(\omega)\exp(j\omega t)$".

From this, the following stand:

$$[a_{m10}-a_{m12}(j\omega)^2+a_{m14}(j\omega)^4\ldots-a_{m1-1}/(j\omega)+a_{m11}(j\omega)-a_{m13}(j\omega)^3\ldots]\exp[-j\omega r_{m1}/c]I_1$$

$$+[a_{m20}-a_{m22}(j\omega)^2+a_{m24}(j\omega)^4\ldots-a_{m2-1}/(j\omega)+a_{m21}(j\omega)-a_{m23}(j\omega)^3\ldots]\exp[-j\omega r_{m2}/c]I_2$$

$$+[a_{m30}-a_{m32}(j\omega)^2+a_{m34}(j\omega)^4\ldots-a_{m3-1}/(j\omega)+a_{m31}(j\omega)-a_{m33}(j\omega)^3\ldots]\exp[-j\omega r_{m3}/c]I_3$$

$$\cdot$$
$$\cdot$$
$$\cdot$$

$$+[a_{mm0}-a_{mm2}(j\omega)^2+a_{mm4}(j\omega)^4\ldots-a_{mm-1}/(j\omega)+a_{mm1}(j\omega)-a_{mm3}(j\omega)^3\ldots]\exp[-j\omega r_{mm}/c]I_m$$

$$\cdot$$
$$\cdot$$
$$\cdot$$

$$+[a_{mN0}-amN2(j\omega)^2+a_{mN4}(j\omega)^4\ldots-a_{mN-1}/(j\omega)+a_{mN1}(j\omega)-a_{mN3}(j\omega)^3\ldots]\exp[-j\omega r_{mN}/c]I_N=V_m \tag{37}$$

Note, more precisely described, $I_p$ is "$I_p(\omega)\exp(j\omega t)$", and more precisely described, $V_m$ is "$V_m(\omega)\exp(j\omega t)$".

Performing a Fourier transform on these equations, the following stand:

$$[-a_{m1-1}/s+a_{m10}+a_{m11}s-a_{m12}s^2-a_{m13}s^3+a_{m14}s^4\ldots]i_1(t-r_{m1}/c)$$

$$+[-a_{m2-1}/s+a_{m20}+a_{m21}s-a_{m22}s^2-a_{m23}s^3+a_{m24}s^4\ldots]i_2(t-r_{m2}/c)$$

$$+[a_{m3-1}/s+a_{m30}+a_{m31}s-a_{m32}s^2-a_{m33}s^3+a_{m34}s^4\ldots]i_3(t-r_{m3}/c)$$

$$\cdot$$
$$\cdot$$
$$\cdot$$

$$+[-a_{mm-1}/s+a_{mm0}+a_{mm1}s-a_{mm2}s^2-a_{mm3}s^3+a_{mm4}s^4\ldots]i_m(t-r/c)$$

.
.
.

$$+[-a_{mN-1}/s+a_{mN0}+a_{mN1}s-a_{mN2}s^2-a_{mN3}s^3+a_{mN4}s^4 \ldots ]i_N(t-r_{mN}/c)=V_m(t) \quad (38)$$

Here, s and 1/s are operators and express "s→d/dt" and "1/s→∫".

In this equation, $r_{mm}$ represents the distance between the element m and the element m and has a value of zero. Taking this into account and shifting all terms on the left side except the term containing $i_m$ of the above equation (38) to the right side, the above equation (38) may be arranged as:

$$[-a_{mm-1}/s+a_{mm0}+a_{mm1}s-a_{mm2}s^2-a_{mm3}s^3+a_{mm4}s^4 \ldots ]i_m(t)=V_m(t)$$

$$+[a_{m1-1}/s-a_{m10}-a_{m11}s+a_{m12}s^2+a_{13}s^3 a_{m14}s^4 \ldots ]i_1(t-r_{m1}/c)$$

$$+a_{m2-1}/s-a_{m20}-a_{m21}s+a_{m22}s^2+a_{m23}s^3-a_{m24}s^4 \ldots ]i_2(t-r_{m2}/c)$$

$$+[a_{m3-1}/s-a_{m30}-a_{m31}s+a_{m32}s^2+m_{33}s^3-a_{m34}s^4 \ldots ]i_3(t-r_{m3}/c)$$

.
.
.

$$+[a_{mN-1}/s-a_{mN0}-a_{mN1}s+a_{mN2}s^2+a_{mN3}s^3-a_{mN4}s^4 \ldots ]i_N(t-r_{mN}/c) \quad (39)$$

This equation stands with respect to any integer where m=1 to N, therefore if "Σ*" is the summation for "n=1 to N" except "n=m", in the end, the following stands with respect to m=1 to N:

$$[-a_{mm-1}/s+a_{mm0}+a_{mm1}s-a_{mm2}s^2-a_{mm3}s^3+a_{mm4}s^4 \ldots ]i_m(t)$$

$$=V_m(t)+\Sigma^*[a_{mn-1}/s-a_{mn0}-a_{mn1}s+a_{mn2}s^2+a_{mn3}s^3+a_{mn4}s^4 \ldots ]i_n(t-r_{mn}/c) \quad (40)$$

In this equation (40), the wave source $v_m(t)$ is known, the approximation coefficient $a_{mn}$ (including also $a_{mm}$) can be found, and "$(t-r_{mn}/c)$" becomes the past time with respect to the present time t, therefore also "$i_n(t-r_{mn}/c)$" is known. From this, the right side of this equation is known. Accordingly, the $i_m(t)$ of the left side, that is, the temporally changing electric current changing over time which flows in the element m, can be solved.

In order to solve this, if the charge corresponding to the electric current $i_m(t)$ is expressed by $q_m(t)$, the $q_m(t)$ becomes "$q_m(t)=i_m(t)/s$". When substituting this into the above equation (40), the following stands with respect to m=1 to N:

$$[-a_{mm-1}+a_{mm0}s+a_{mm1}s^2-a_{mm2}s^3-a_{mm3}s^4+a_{mm4}s^5 \ldots ]q_m(t)$$

$$=v_m(t)+\Sigma^*[a_{mn-1}-a_{mn0}s-a_{mn1}s^2+a_{mn2}s^3+a_{mn3}s^4-a_{mn4}s^5 \ldots ]q_n(t-r_{mn}/c) \quad (41)$$

Further, when the nth differential of "$q_m(t)$" is expressed by "$q_m^n(t)$", this equation becomes:

$$[-a_{mm-1}q_m(t)+a_{mm0}q_m^1(t)+a_{mm1}q_m^2(t)-a_{mm2}q_m^3(t)-a_{mm3}q_m^4(t)+a_{mm4}q_m^5(t) \ldots ]$$

$$=v_m(t)+\Sigma^*[$$

$$a_{mn-1}q_n(t-r_{mn}/c)-$$

$$a_{mn0}q_n^1(t-r_{mn}/c)-$$

$$a_{mn1}q_n^2(t-r_{mn}/c)+$$

$$a_{mn2}q_n^3(t-r_{mn}/c)+$$

$$a_{mn3}q_n^4(t-r_{mn}/c)-$$

$$a_{mn4}q_n^5$$

$$(t-r_{mn}/c) \ldots ] \quad (42)$$

As seen from the above, the "$q_n(t-r_{mn}/c)$", "$q_n^1(t-r_{mn}/c)$", and "$q_n^2(t-r_{mn}/c)$" . . . at the right side of this equation are the values at the time "$r_{mn}/c$" before the present time (t) regarding charges of elements other than the element m, differentiation of charges (becomes electric current) and a second or higher order differential of the charge and are known values when seen from the present time. Further, $v_m(t)$ is a function of the time domain of the wave source, so is known. Also, the approximation coefficient $a_{mn}$ (including also $a_{mm}$) can be found.

From this, the right side of this equation becomes known, and "$q_m(t)$", "$q_m^1(t)$", "$q_m^2(t)$" . . . can be solved as usual simultaneous differential equations. For example, they can be solved by the procedure as disclosed in "Ono (supervised); Numeric Computation Handbook, p. 193, Ohm Co. (1990)".

Namely, by solving these simultaneous differential equations, "$q_m(t)$", "$q_m^1(t)$", "$q_m^2(t)$" in the time domain can be found for the element m.

Here, the higher order differential terms of these simultaneous differential equations can be removed in accordance with the degree of approximation. If the wavelength of the highest frequency to be analyzed is made λ and the length of the monopole is made 0.05 λ or less, a sufficient precision is obtained up to a third differential. In this case, simultaneous differential equations using approximation coefficients "$a_{mn-1}$, $a_{mn0}$, $a_{mn1}$, $a_{mn2}$ (including also m=n) "such as:

$$[-a_{mm-1}q_m(t)+$$

$$a_{mm0}q_m^1(t)+$$

$$a_{mm1}q_m^2(t)-$$

$$a_{mm2}q_m^3(t)]$$

$$=v_m(t)+\Sigma^*[a_{mn-1}q_n$$

$$(t-r_{mn}/c)-a_{mn0}q_n^1$$

$$(t-r_{mn}/c)-a_{mn1}q_n^2$$

$$(t-r_{mn}/c)+a_{mn2}q_n^3$$

$$(t-r_{mn}/c) \quad (43)$$

are to be solved.

FIGS. 4A and 4B and FIGS. 5A and 5B are flow charts of the processing to be executed by the simulation program. A detailed explanation will be made of the present invention according to the flows of FIGS. 4A and 4B and FIGS. 5A and 5B executed by the simulation program 100.

When a request for simulation is issued, as shown by the flow of processing of FIGS. 4A and 4B and FIGS. 5A and 5B, first, at step 1, the simulation program 100 reads the configuration information of the electronic apparatus to be simulated from the configuration data file 2. Next, at step 2, it segments the read configuration information into mesh-like elements.

Subsequently, at step 3, the approximation coefficient is found when approximating the mutual impedance $Z_{mn}$ (including m=n) between segmented element m and element n as:

$$Z_{mn} = \exp[-j\omega r_{mn}/c] \times [a_{mn0} - a_{mn2}(j\omega)^2 + a_{mn4}(j\omega)^4 - a_{mn6}(j\omega)^6 \ldots$$
$$-a_{mn-1}/(j\omega) + a_{mn1}(j\omega) - a_{mn3}(j\omega)^3 + a_{mn5}(j\omega)^5 \ldots] \quad (44)$$

Figure 6:
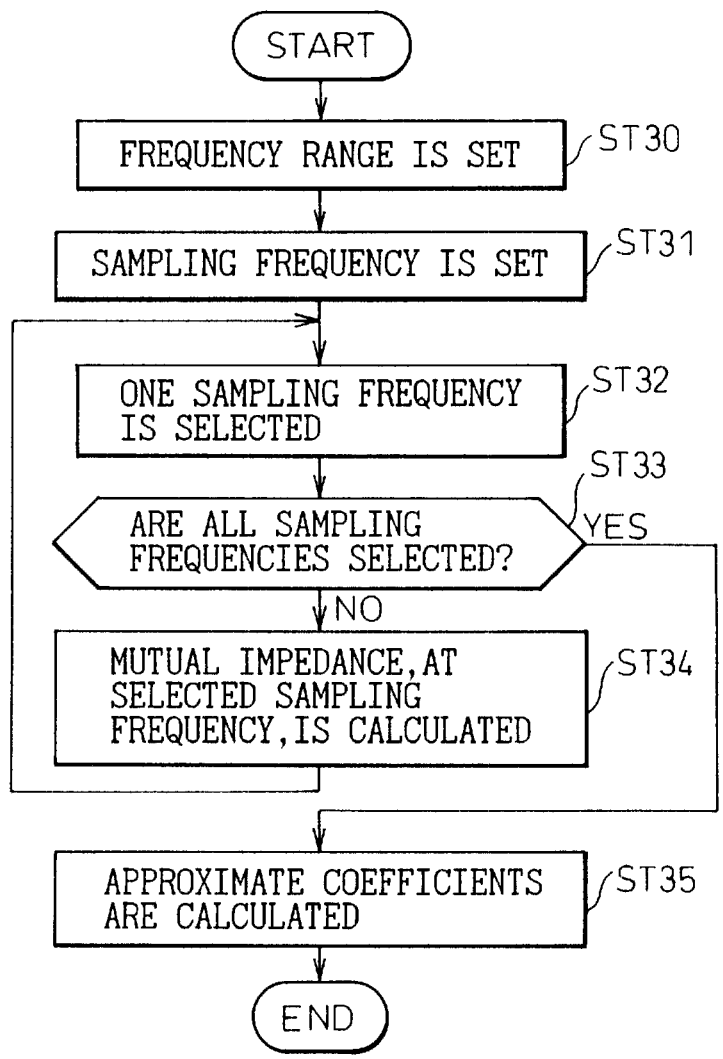
FIG. 6 is a view for explaining processing for calculating approximation coefficients.

FIG. 6 is a flow chart of the detailed processing for calculation of this approximation coefficient.

As shown in the flow of processing of FIG. 6, when starting the processing for calculation of the approximation coefficient at step 3 of the flows of processing of FIGS. 4A and 4B and FIGS. 5A and 5B, first, at step 30, the frequency range to be simulated is set.

At the next step 31, the sampling frequency is set from among these frequencies. At this time, the number of sampling frequencies to be set is determined by the degree of approximation of the approximation coefficient to be sought.

For example, when solving the simultaneous differential equations:

$$[-a_{mm-1}q_m(t) +$$
$$a_{mm0}q_m^{\,1}(t) +$$
$$a_{mm1}q_m^{\,2}(t) -$$
$$a_{mm2}q_m^{\,3}(t)] =$$
$$v_m(t) + \Sigma^*[a_{mn-1}q_n$$
$$(t-r_{mn}/c) - a_{mn0}q_n^{\,1}$$
$$(t-r_{mn}/c) - a_{mn1}$$
$$q_n^{\,2}(t-r_{mn}/c) + a_{mn2}$$
$$q_n^{\,3}(t-r_{mn}/c) \quad (45)$$

it is necessary to find the approximation coefficients "$a_{mn-1}$, $a_{mn0}$, $a_{mn1}$, $a_{mn2}$", therefore, as seen from the later explanation, two sampling frequencies are set.

Next, at step 32, one unselected sampling frequency is selected from among the set sampling frequencies. At the next step 33, it is decided whether or not all of the sampling frequencies have been selected. When it is decided that not all sampling frequencies have been selected, that is, when it is decided that one sampling frequency can be selected at step 32, the operation routine proceeds to step 34, at which the mutual impedance $Z_{mn}$ between the element m and the element n is calculated according to a precise computation procedure, then the operation routine returns to step 32.

On the other hand, when it is decided at step 33 that all sampling frequencies have been selected, the operation routine proceeds to step 35, at which the mutual impedance $Z_{mn}$ calculated at step 34 is substituted into the above approximation expression, whereby the simultaneous equations for finding approximation coefficients are prepared. These are then solved to find the approximation coefficients.

For example, in order to find the approximation coefficients "$a_{mn1}$, $a_{mn0}$, $a_{mn1}$, $a_{mn2}$" (including also m=n), when setting two sampling frequencies (angular frequencies $\omega_{s1}$ and $\omega_{s2}$), as mutual impedances $Z_{mn}(\omega_{s1})$ and $Z_{mn}(\omega_{s2})$ between the element m and the element n, the following is found according to the precise computing procedure:

$$Z_{mn}(\omega_{s1}) = \alpha_{mn}(\omega_{s1}) + j\mu_{mn}(\omega_{s1})$$
$$Z_{mn}(\omega_{s2}) = \alpha_{mn}(\omega_{s2}) + j\mu_{mn}(\omega_{s2}) \quad (46)$$

and the following simultaneous equations are prepared:

$$\alpha_{mn}(\omega_{s1}) = \exp[-j\omega_{s1}r_{mn}/c][a_{mn0} + a_{mn2}\omega_{s1}^{\,2}]$$
$$\alpha_{mn}(\omega_{s2}) = \exp[-j\omega_{s2}r_{mn}/c][a_{mn0} + a_{nm2}\omega_{s2}^{\,2}]$$

$$\beta_{mn}(\omega_{s1}) = \exp[-j\omega_{s1}r_{mn}/c][a_{mn-1}/\omega_{s1} + a_{mn1}\omega_{s1}]$$
$$\beta_{mn}(\omega_{s2}) = \exp[-j\omega_{s2}r_{mn}/c][a_{mn-1}/\omega_{s2} + a_{mn1}\omega_{s2}] \quad (47)$$

They are then solved to find the approximation coefficients "$a_{mn-1}$, $a_{mn0}$, $a_{mn1}$, $a_{mn2}$".

Below, for convenience of explanation, it is assumed that the simulation program 100 solves the following simultaneous differential equations taking up to the third differential into account:

$$[-a_{mm-1}q_m(t) + a_{mm0}q_m^{\,1}(t) + a_{mm1}q_m^{\,2}(t) - a_{mm2}q_m^{\,3}(t)]$$
$$= v_m(t) + \Sigma^*[a_{mn-1}q_n(t-r_{mn}/c) - a_{mn0}q_n^{\,1}(t-r_{mn}/c) - a_{mn1}q_n^{\,2}(t-r_{mn}/c) + a_{mn2}q_n^{\,3}(t-r_{mn}/c) \quad (48)$$

Accordingly, at step 3, the approximation coefficients "$a_{mn-1}$, $a_{mn0}$, $a_{mn1}$, $a_{mn2}$, (including also m=n)" are found. The thus found approximation coefficients are stored in the work memory 200.

In this way, when the approximation coefficients of the approximation expression of the mutual impedance $Z_{mn}$ (including m=n) between the segmented element m and element n are found at step 3 of the flows of processing of FIGS. 4A and 4B and FIGS. 5A and 5B, at step 4, the analysis points (element and observation point) are set, and the type of analysis is set such as whether to calculate the electric current of the time domain flowing in that analysis point (element), whether to calculate the charge in the time domain staying in that analysis point (element), or whether to calculate the intensity of the electromagnetic field in the time domain produced in that analysis point (observation point).

Next, at step 5, the analysis time T, number of time steps S, and time step dt (=T/S) are set.

Next, at step 6, a distance $R_{max}$ with the furthest element is detected for every element segmented at step 2 and the propagation time of the distance is computed according to "$R_{max}/c$ (c is the speed of light)".

As explained above, in order to solve the following simultaneous differential equations:

$$[-a_{mm-1}q_m(t) + a_{mm0}q_m^{\,1}(t) + a_{mm1}q_m^{\,2}(t) - a_{mm2}q_m^{\,3}(t)]$$
$$= v_m(t) + \Sigma^*[a_{mn-1}q_n(t-r_{mn}/c) - a_{mn0}q_n^{\,1}(t-r_{mn}/c) - a_{mn1}q_n^{\,2}(t-r_{mn}/c) + a_{mn2}q_n^{\,3}(t-r_{mn}/c) \quad (49)$$

values of time ($r_{mn}/c$) before the present time, that is, "$q_n(t-r_{mn}/c)$", "$q_n^{\,1}(t-r_{mn}/c)$", "$q_n^{\,2}(t-r_{mn}/c)$", and "$q_n^{\,3}(t-r_{mn}/c)$", are used, therefore it is necessary to hold the past data in the work memory 200.

On the other hand, if the electric current in the time domain flowing in each element is found, it is possible to evaluate the electromagnetic immunity and possible to compute the electromagnetic field produced at the observation point. From this, in this embodiment, the entire time series data of "$q_m^{\,1}(t)$ (m=1 to N)" for each element found by solving these simultaneous differential equations is held.

Nevertheless, it is not necessary to hold all past data for "$q_m(t)$ (m=1 to N)", "$q_m^{\,2}(t)$ (m=1 to N)", and "$q_m^{\,3}(t)$ (m=1 to N)". The past data closest in time which must be held is defined by the propagation time (=$r_{mn}/c$) obtained by dividing the maximum value of $r_{mn}$ by the speed of light. Namely, as shown in FIG. 7, when there is an element a as the element furthest from the element m and there are an element b and an element c as nearer elements than this, if the past data determined by the propagation time "$r_{ma}/c$" of the distance $r_{ma}$ between the element m and the element a is held for the element m, the past data necessary for the element b and the element c will be able to be held.

Figure 7:
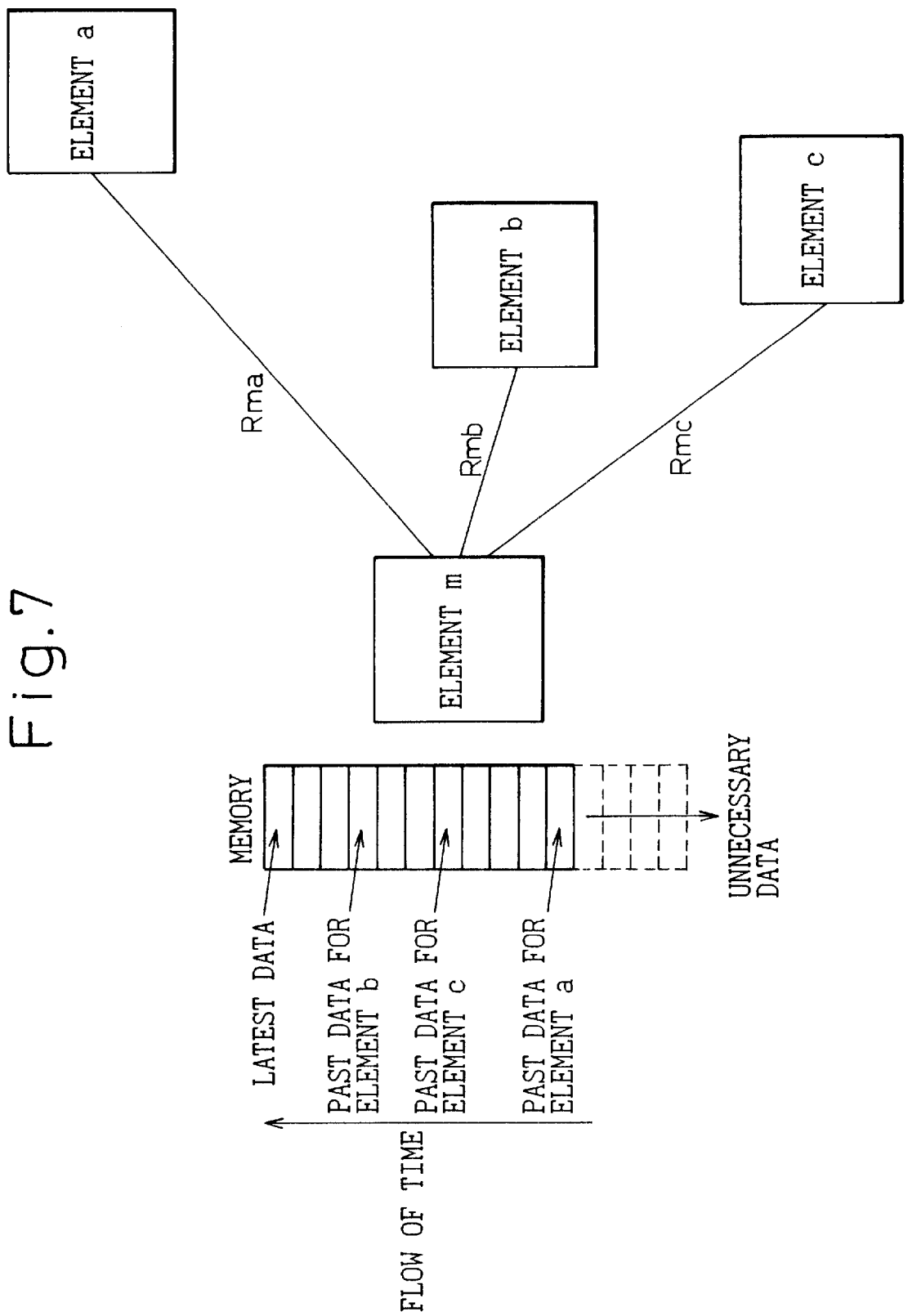
FIG. 7 is a view for explaining past data to be retained.

FIG. 7 is a view for explaining the past data to be retained.

From this, at this step 5, in order to determine how much of the past-returned data must be held for "$q_m(t)$ (m=1 to N)", "$q_m^1(t)$ (m=1 to N)", and "$q_m^3(t)$ (m=1 to N)", the distance $R_{max}$ between each element and the furthest element is detected for every element segmented at step 2, and the propagation time in that distance is computed according to "$R_{max}/c$". By retaining only the past data found by this computation, it becomes possible to keep the amount of the work memory 200 used to the required smallest limit.

Next, at step 7, the initial values for a charge "$q_m(t)$ (m=1 to N)", a first differential "$q_m^1(t)$ (m=1 to N)" of that charge, a second differential "$q_m^2(t)$ (m=1 to N)" of that charge, and a third differential "$q_m^3(t)$ (m=1 to N)" of that charge are set and stored in the work memory 200. Namely, "$q_m(0)$ (m=1 to N)", "$q_m^1(0)$ (m=1 to N)", "$q_m^2(0)$ (m=1 to N), and $q_m^3(0)$ (m=1 to N)" necessary for solving the above simultaneous differential equations are set and stored in the work memory 200.

Next, at step 8, an initial value "0" is set to a variable I for defining the number of time steps. Next, at step 9, it is decided whether or not the value of the variable I has reached the maximum value S of the number of time steps.

When it is decided that the value of the variable I has not reached the maximum value S of the number of time steps according to this decision processing, the operation routine proceeds to step 10, at which "t=dt×I" is set as the present time t. At the next step 11, an initial value "1" is set to the variable m for specifying the element.

Subsequently, at step 12, it is decided whether or not the value of the variable m has exceeded the element number N. When deciding that it has not exceeded the latter, the operation routine proceeds to step 13, at which, by using the element m specified by the variable m as the analysis object, known data (data indicating the state of present time t etc.) necessary for solving the simultaneous differential equations such as:

$$[-a_{mm-1}q_m(t)+a_{mm0}q_m^1(t)+a_{mm1}q_m^2(t)-a_{mm2}q_m^2(t)]$$
$$=v_m(t)+\Sigma^*[a_{mn-1}q_n(t-r_{mn}/c)-a_{mm0}q_n^1(t-r_{mn}/c)-a_{mn1}q_n^2(t-r_{mn}/c)+a_{mn2}q_n^3(t-r_{mn}/c)] \quad (50)$$

are read from the work memory 200. These simultaneous differential equations are set to form simultaneous differential equations for finding "$q_m(t)$", "$q_m^1(t)$", "$q_m^2(t)$", and "$q_m^3(t)$" at "t+dt".

For example, first, when entering step 13, since the "variable I=0", "t=0" stands, $$\text{``}q_m(0)\text{''}, \text{``}q^1(0)\text{''}, \text{``}q/m^2(0)\text{''}, \text{``}q_m^3(0)$$

and $$\text{``}q_n(0-r_{mn}/c)=q_n(0)\text{''}, \text{``}q_n^1(0-r_{mn}/c)=q_n^1(0)\text{''}$$
$$\text{``}q_n^2(0-r_{mn}/c)=q_n^2(0)\text{''}, \text{``}q_n^1(0-r_{mn}/c)=q_n^1(0)\text{''}$$

where, n≠m
and
"$a_{mn-1}$", "$a_{mn0}$", $a_{mn1}$", and "$a_{mn2}$"
where, including also n=m and the wave source $v_m(t)$ are read from the work memory 200. According to them, simultaneous differential equations for finding "$q_m(t)$", "$q_m^1(t)$", "$q_m^2(t)$", and "$q_m^3(t)$" at "t+dt" are set.

Next, at step 14, by solving the differential equation formed at step 13 according to the procedure disclosed in "Ono (supervised); Numeric Computation Handbook, p. 193, Ohm Co. (1990)", "$q_m(t)$", "$q_m^1(t)$", "$q_m^2(t)$", and "$q_m^3(t)$" at "t+dt" are found.

Next, at step 15, the "$q_m(t)$", "$q_m^1(t)$", "$q_m^2(t)$", and "$q_m^3(t)$" found at step 14 is stored in the work memory 200. At the next step 16, the value of the variable m is incremented by one, and the operation routine returns to step 12 in order to process the next element.

In this way, by applying the processing of step 13 through step 15 to each element, the charge of each element at the time "t+dt", the electric current of the first differential of that charge, and the value of second or higher order differential of that charge are calculated. At step 12, it is decided that the value of the variable m exceeds the element number N, therefore when deciding this, the operation routine proceeds to step 17, at which the past data stored in the work memory 200 and now unnecessary is erased.

Namely, as explained above, in this embodiment, all past data is retained for "$q_m^1(t)$ (m=1 to N)". In contrast, the past data up to "$t-R_{max}/c$" before is retained for "$q_m^2(t)$ (m=1 to N)", "$q_m^3(t)$ (m=1 to N)", and "$q_m^1(t)$ (m=1 to N)" to reduce the required memory capacity. Therefore, at step 17, processing is carried out so that the past data before than this in time is erased and so that only that data which becomes necessary for solving the simultaneous differential equations are retained.

Next, at step 18, the value of the variable I is incremented by one, and the operation routine returns to step 9 so as to find "$q_m(t)$", "$q_m^1(t)$", "$q_m^2(t)$", and "$q_m^3(t)$" at the next time at which the time of the time step dt elapses.

By repeating the processing of step 10 through step 18 for each element in this way to find "$q_m^2(t)$", "$q_m^1(t)$", "$q_m^2(t)$", and "$q_m^3(t)$" each time the time step dt elapses, it is decided at step 9 that the analysis time T has ended. When deciding this, the operation routine proceeds to step 19, at which, according to the instruction of the set information set at step 4, the electric current of the time domain of the element which is the analysis point or the charge of the time domain is output to the output data file 3 or the electromagnetic field of the time domain at the observation point which is the analysis point is calculated and output to the output data file 3, whereby the processing is terminated.

Namely, when the output of the electric current of the time domain flowing in the element p which is the analysis point is instructed, taking into account the fact that "$q_p(t)=i_p(t)/s$", the time series data "$q_p^1(t)$" of the element p which is the analysis point, i.e.:

$$q_p^1(0), q_p^1(dt), q_p^1(2dt), \ldots q_p^1(Sdt)$$

is read from the work memory 200 and output to the output data file 3.

Further, when the output of the charge of the time domain flowing in the element p which is the analysis point is instructed, time series data "$q_p(t)$" of the element p which is the analysis point, i.e.:

$$q_p(0), q_p(dt), q_p(2dt), \ldots q_p(Sdt)$$

is read from the work memory 200 and output to the output data file 3.

Further, when the output of the intensity of the electromagnetic field of the time domain produced at the observation point which is the analysis point is instructed, time series data "$q_m^1(t)$" for all elements, i.e.:

$$q_1^1(0), q_1^1(dt), q_1^1(2dt), \ldots q_1^1(Sdt)$$
$$q_2^1(0), q_2^1(dt), q_2^1(2dt), \ldots q_2^1(Sdt)$$
$$q_3^1(0), q_3^1(dt), q_3^1(2dt), \ldots q_3^1(Sdt)$$
$$q_N^1(0), q_N^1(dt), q_N^1(2dt), \ldots q_N^1(Sdt)$$

is read from the work memory 200 to read the electric currents of the time domain flowing in the elements. Using this, the intensity of the electromagnetic field generated at the observation point is calculated according to the known electromagnetic theoretical equation and output to the output data file 3.

In this way, the simulation apparatus 1 of the present invention can simulate the effect of a wave source with respect to an electronic apparatus in the time domain, therefore it becomes possible to clarify why an electronic apparatus radiates undesired radio waves or noise and why an electronic apparatus malfunctions due to radio waves or noise.

This embodiment assumes to solve the simultaneous equations of the moment method shown in FIG. 3 taking only mutual impedance into account, but the present invention can also be applied as it is to a case of solving the simultaneous equations of the moment method shown in FIG. 8 which takes the existence of a dielectric into account.

Namely, the mutual admittance $Y_{ij}$ shown in FIG. 8 can be approximated as mentioned above as:

$$Y_{ij}=e^{-jkr0}[(a_0+a_1 f^2 \\
+a_2 f^4+a_3 f^6+a_4 f^8 \\
+ \ldots ) \\
+j(b_0 f^{-1}+b_1 f+b_2 \\
f^3+b_3 f^5+b_4 f^7 \\
+ \ldots )] \tag{51}$$

and the mutual reaction $B_{ij}$ can be approximated as mentioned above as:

$$B_{ij}=e^{-jkr0}[(a_0 \\
+a_1 f^2+a_2 f^4 \\
+a_3 f^6+a_4 f^8+\ldots)+ \\
j(b_0 f+b_1 f^3+b_2 \\
f^5+b_3 f^7+b_4 f^9 \\
+ \ldots )] \tag{52}$$

therefore the present invention can be realized according to the above method applied to the mutual impedance $Z_{ij}$.

When solving the simultaneous equations of the moment method shown in FIG. 8, by taking the existence of the dielectric into account, the electric current flowing on the surface of the dielectric and the magnetic current flowing on the surface of the dielectric are also taken into account.

Here, in the equations shown in FIG. 8, $I_{c,n}$ represents the electric current flowing in a conductor (metal), $I_{d,n}$ represents the electric current flowing on the surface of the dielectric, $M_n$ represents the magnetic current flowing on the surface of the dielectric, the right top numeral 0 represents the value in air, the right top character d represents the value in the dielectric, suffixes c represent metal, and suffixes d represent the dielectric.

Note that, in the above embodiment, the approximation expression of the mutual impedance $Z_{ij}$ was expressed as follows in a format where the exponent power value and individual elements can be seen:

$$Z_{ij}=\exp[-j\omega r_{ij}/c]\times[a_{ij0}-a_{ij2}(j\omega)^2+a_{ij4}(j\omega)^4-a_{ij6}(j\omega)^6 \ldots -a_{ij-1}/(j\omega)+ \\ a_{ij1}(j\omega)-a_{ij3}(j\omega)^3+a_{ij5}(j\omega)^5 \ldots ] \tag{53}$$

The approximation expression of the mutual admittance $Y_{ij}$ may be expressed as follows if this descriptive format is followed:

$$Y_{ij}=\exp[-j\omega r_{ij}/c]\times[a_{ij0}-a_{ij2}(j\omega)^2+a_{ij4}(j\omega)^6 \ldots -a_{ij-1}/(j\omega)+a_{ij1}(j\omega)^3+ \\ a_{ij5}(j\omega)^5 \ldots ] \tag{54}$$

Further, the mutual reaction $B_{ij}$ may be expressed as follows if this descriptive format is followed:

$$B_{ij}=\exp[-j\omega r_{ij}/c]\times[a_{ij0}-a_{ij2}(j\omega)^2+a_{ij4}(j\omega)^4-_{ij6}(j\omega)^6 \ldots +a_{ij1}(j\omega)- \\ a_{ij3}(j\omega)^3+a_{ij5}(j\omega)^5-a_{ij7}(j\omega)^7 \ldots ] \tag{55}$$

Also, while the present invention was explained according to the illustrated embodiment, the present invention is not limited to this.

For example, in this embodiment, taking into account the fact that by finding the electric current in the time domain flowing in each element, it is possible to evaluate the electromagnetic immunity and it is possible to calculate the electromagnetic field generated at an observation point, a structure was shown of retaining all past data of "$q_m^1(t)$" for each element found by solving the simultaneous differential equations:

$$[-a_{mm-1}q_m(t)+a_{mm0}q_m^{1} \\
(t)+a_{mm1}q_m^{2}(t)- \\
a_{mm2}q_m^{3}(t)=v_m \\
(t)+\Sigma^*[a_{mn-1}q_n \\
(t-r_{mn}/c)-a_{mn0}q_n^{1} \\
(t-r_{mn}/c)-a_{mu1}q_n^{2} \\
(t-r_{mn}/c)+a_{mn2}q_n^{3} \\
(t-r_{mn}/c) \tag{56}$$

but it is also possible to retain "$q_m^1(t)$", "$q_m^2(t)$", or "$q_m^3(t)$" in place of "$q_m^1(t)$" and find the electric current in the time domain flowing in each element from them.

As explained above, according to the present invention, the electric current changing over time which flows in an electronic apparatus due to noise or the like and the intensity of the electromagnetic field changing over time which is radiated from the electronic apparatus can be simulated. By this, it becomes possible to solve why an electronic apparatus radiates undesired radio waves or noise and why an electronic apparatus malfunctions due to radio waves or noise.

While the invention has been described by reference to specific embodiments chosen for purposes of illustration, it should be apparent that numerous modifications could be made thereto by those skilled in the art without departing from the basic concept and scope of the invention.

What is claimed is:

1. A simulation apparatus using a moment method which segments an electronic apparatus into elements, so as to simulate an electric current flowing in the elements, the simulation apparatus comprising:

a first calculator that calculates a mutual impedance at a sampling frequency, calculates an approximation coefficient, and expresses the mutual impedance in an approximation expression, based on the mutual impedance and the sampling frequency, in terms of an exponent and exponent powers;

a translator that forms a plurality of simultaneous differential equations by setting the approximation coefficient to an initial value with respect to the plurality of simultaneous differential equations derived by performing a Fourier transform on a plurality of simultaneous equations of the moment method into which the approximation expression is substituted; and a second calculator that calculates an electric current in a time domain flowing in a specified element or that calculates related values of the time domain and derives the electric current by solving the simultaneous differential equations formed by the translator and calculating the electric current.

2. A simulation apparatus using a moment method as set forth in claim 1, further comprising a third calculator that calculates at least one of an electric field and a magnetic field in the time domain at an observation point by using the electric current flowing in each element calculated by the second calculator.

3. A simulation apparatus using a moment method as set forth in claim 1, wherein the first calculator calculates an approximation coefficient $a_{mn}$ when approximating a mutual impedance $Z_{mn}$ between an element m and an element n as:

$$Z_{mn} = \exp(-j\omega r_{mn}/c)$$

$$X(a_{mn0} - a_{mn2}(j\omega)^2 + a_{mn4}(j\omega)^4 - a_{mn6}(j\omega)^6 \ldots$$

$$-a_{mn-1}/(j\omega) + a_{mn1}(j\omega) - a_{mn3}(j\omega)^3 + a_{mn5}(j\omega)^5 \ldots)$$

where, $\omega$: angular frequency, c: speed of light, $r_{mn}$: distance between the element m and the element n, $a_{mx}$: approximation coefficient (x indicates the order of $\omega$).

4. A simulation apparatus using a moment method as set forth in claim 2, wherein the first calculator calculates an approximation coefficient $a_{mn}$ when approximating a mutual impedance $Z_{mn}$ between an element m and an element n as:

$$Z_{mn} = \exp(-j\omega r_{mn}/c)$$

$$X(a_{mn0} - a_{mn2}(j\omega)^2 + a_{mn4}(j\omega)^4 - a_{mn6}(j\omega)^6 \ldots$$

$$-a_{mn-}/(j\omega) + a_{mn1}(j\omega) - a_{mn3}(j\omega)^3 + a_{mn6}(j\omega)^5 \ldots)$$

where, $\omega$: angular frequency, c: speed of light, $r_{mn}$: distance between the element m and the element n, $a_{mx}$: approximation coefficient (x indicates the order of $\omega$).

5. A simulation apparatus using a moment method as set forth in claim 3, wherein when assuming that the number of said elements is N, the translator forms the simultaneous differential equations:

$$(-a_{mm-1}q_m(t) + a_{mm0}q_m^1(t) + a_{mm1}q_m^2(t) - a_{mm2}q_m^3(t)$$

$$-a_{mm3}q_m^4(t) + a_{mm4}q_m^5(t) \ldots)$$

$$= v_m(t) + \Sigma^*(a_{mn-1}q_n(t-r_{mn}/c) - a_{mn0}q_n^1(t-r_{mn}/c)$$

$$-a_{mn1}q_n^2(t-r_{mn}/c) + a_{mn2}q_n^3(t-r_{mn}/c)$$

$$+a_{mn3}q_n^4(t-r_{mn}/c) - a_{mn4}q_n^5(t-r_{mn}/c) \ldots)$$

where, m=1 to N, $v_m(t)$: wave source possessed by element m, $\Sigma^*$: summation for "n=1 to N" except for "n=m", $q_m(t)$: charge corresponding to electric current $i_m(t)$ ($i_m=$)d/dt])$q_m$), $q_m^n(t)$: nth differential of $q_m(t)$.

6. A simulation apparatus using a moment method as set forth in claim 4, wherein when assuming that the number of said elements is N, the translator forms the simultaneous differential equations:

$$(-a_{mm-1}q_m(t) + a_{mm0}q_m^1(t) + a_{mm1}q_m^2(t) - a_{mm2}q_m^3(t)$$

$$-a_{mm3}q_m^4(t) + a_{mm4}q_m^5(t) \ldots)$$

$$= v_m(t) + \Sigma^*(a_{mn-1}q_n(t-r_{mn}/c) - a_{mn0}q_n^1(t-r_{mn}/c)$$

$$-a_{mn1}q_n^2(t-r_{mn}/c) + a_{mn2}q_n^3(t-r_{mn}/c)$$

$$+a_{mn3}q_n^4(t-r_{mn}/c) - a_{mn4}q_n^5(t-r_{mn}/c) \ldots)$$

where, m=1 to N, $v_m(t)$: wave source possessed by element m, $\Sigma^*$: summation for "n=1 to N" except for "n=m", $q_m(t)$: charge corresponding to electric current $i_m(t)$ ($i_m=(d/dt])q_{m)}$, $q_m^n(t)$: nth differential of $q_m(t)$.

7. A simulation apparatus using the moment method as set forth in claim 5, further comprising an eraser that erases data, from a memory, which becomes unneeded due to an elapse of a propagation time $r_{mn}(max)$ (maximum value of $r_{mn}$) among $q_n^y (t-r_{mn}/c)$ (y=0, 1, 2, . . . ) which becomes necessary for solving $q_n^y(t)$ (y=0, 1, . . . ).

8. A simulation apparatus using the moment method as set forth in claim 6, further comprising an eraser that erases data, from a memory, which becomes uneeded due to an elapse of a propagation time $r_{mn2}(max)$ (maximum value of $r_{mn}$) among $q_n^y(t-r_{mn}/c)$ (y=0, 1, 2, . . . ) which becomes necessary for solving $q_n^y(t)$ (y=0, 1, . . . ).

9. A simulation apparatus using a moment method which segments an electronic apparatus into elements, so as to simulate an electric current and a magnetic current flowing in the elements, the simulation apparatus comprising:

a first calculator that calculates a mutual impedance, a mutual admittance, and a mutual reaction at a sampling frequency, calculates a plurality of approximation coefficients, and expresses the mutual impedance, the mutual admittance, and the mutual reaction in a plurality of approximation expressions in terms of exponents and exponent powers;

a translator that forms a plurality of simultaneous differential equations by setting the approximation coefficients to an initial value with respect to the plurality of simultaneous differential equations derived by performing a Fourier transform on a plurality of simultaneous equations of the moment method in which the approximation expressions are substituted; and a second calculator that calculates an electric current and a magnetic current in a time domain flowing through the specified element or that calculates related values in the time domain and derives the electric current and magnetic current by solving the simultaneous differential equations formed by the translator and calculating the electric current and the magnetic current.

10. A simulation apparatus using a moment method as set forth in claim 9, further comprising a third calculator that calculates at least one of an electric field and a magnetic field in the time domain at an observation point by using the electric current and magnetic current flowing through each element calculated by the second calculator.

11. A simulation apparatus using a moment method as set forth in claim 9, wherein the first calculator calculates an approximation coefficient $a_{mn}$ when approximating a mutual impedance $Z_{mn}$ between an element m and an element n as:

$$Z_{mn} = \exp(-j\omega r_{mn}/c)$$

$$X(a_{mn0} - a_{mn2}(j\omega)^2 + a_{mn4}(j\omega)^4 - a_{mn6}(j\omega)^6 \ldots$$

$$-a_{mn-1}/(j\omega) + a_{mn1}(j\omega) - a_{mn3}(j\omega)^3 + a_{mn5}(j\omega)^5 \ldots$$

where, $\omega$: angular frequency, c: speed of light, $r_{mn}$: distance between the element m and the element n, $a_{mn}$: approximation coefficient (x indicates the order of $\omega$).

12. A simulation apparatus using a moment method as set forth in claim 10, wherein the first calculator calculates an approximation coefficient $a_{mn}$, when approximating a mutual impedance $Z_{mn}$ between an element m and an element n as:

$Z_{mn}=\exp(-j\omega r_{mn}/c)$ $X(a_{mn0}-a_{mn2}(j\omega)^2+a_{mn4}(j\omega)^4-a_{mn6}(j\omega)^6 \ldots$ $-a_{mn-1}/(j\omega)+a_{mn1}(j\omega)-a_{mn3}(j\omega)^3+a_{mn5}(j\omega)^5 \ldots$ where, $\omega$: angular frequency, c: speed of light, $r_{mn}$: distance between the element m and the element n, $a_{mx}$: approximation coefficient (x indicates the order of $\omega$).

13. A simulation apparatus using a moment method as set forth in claim 9, wherein the first calculator calculates an approximation coefficient $a_{mn}$ when approximating a mutual admittance $Y_{mn}$ between an element m and an element n as:

$Y_{mn}=\exp(-j\omega r_{mn}/c)$ $X(a_{mn0}-a_{mn2}(j\omega)^2+a_{mn4}(j\omega)^4-a_{mn6}(j\omega)^6 \ldots$ $-a_{mn-1}/(j\omega)+a_{mn1}(j\omega)-a_{mn3}(j\omega)^3+a_{mn5}(j\omega)^5 \ldots$ where, $\omega$: angular frequency, c: speed of light, $r_{mn}$: distance between the element m and the element n, $a_{mx}$: approximation coefficient (x indicates the order of $\omega$).

14. A simulation apparatus using a moment method as set forth in claim 10, wherein the first calculator calculates an approximation coefficient $a_{mn}$ when approximating a mutual admittance $Y_{mn}$ between an element m and an element n as:

$Y_{mn}=\exp(-j\omega r_{mn}/c)$ $X(a_{mn0}-a_{mn2}(j\omega)^2+a_{mn4}(j\omega)^4-a_{mn6}(j\omega)^6 \ldots$ $-a_{mn-1}/(j\omega)+a_{mn1}(j\omega)-a_{mn3}(j\omega)^3+a_{mn5}(j\omega)^5 \ldots$ where, $\omega$: angular frequency, c: speed of light, $r_{mn}$: distance between the element m and the element n, $a_{mx}$: approximation coefficient (x indicates the order of $\omega$).

15. A simulation apparatus using the moment method as set forth in claim 9, wherein the first calculator calculates an approximation coefficient $a_{mn}$ when approximating a mutual reaction $B_{mn}$ between an element m and an element n as:

$B_{mn}=\exp(-j\omega r_{mn}/c)$ $X(a_{mn0}-a_{mn2}(j\omega)^2+a_{mn4}(j\omega)^4-a_{mn6}(j\omega)^6 \ldots$ $-a_{mn-1}/(j\omega)+a_{mn1}(j\omega)-a_{mn3}(j\omega)^3+a_{mn5}(j\omega)^5 \ldots$ where, $\omega$: angular frequency, c: speed of light, $r_{mn}$: distance between the element m and the element n, $a_{mx}$: approximation coefficient (x indicates the order number of $\omega$).

16. A simulation apparatus using the moment method as set forth in claim 10, wherein the first calculator calculates an approximation coefficient $a_{mn}$, when approximating a mutual reaction $B_{mn}$ between an element m and an element n as:

$B_{mn}=\exp(-j\omega r_{mn}/c)$ $X(a_{mn0}-a_{mn2}(j\omega)^2+a_{mn4}(j\omega)^4-a_{mn6}(j\omega)^6 \ldots$ $-a_{mn-1}/(j\omega)+a_{mn1}(j\omega)-a_{mn3}(j\omega)^3+a_{mn5}(j\omega)^5 \ldots$ where, $\omega$: angular frequency, c: speed of light, $r_{mn}$: distance between the element m and the element n, $a_{mx}$: approximation coefficient (x indicates the order number of $\omega$).

17. A method of simulation using a moment method which segments an electronic apparatus into elements, so as to simulate an electric current flowing in the elements, comprising:

calculating a mutual impedance at a sampling frequency and calculating an approximation coefficient, expressing the mutual impedance by an approximation expression in terms of an exponent and exponent powers;

forming a plurality of simultaneous differential equations by setting the approximation coefficient to an initial value with respect to the simultaneous differential equations derived by performing a Fourier transform on a plurality of simultaneous equations of the moment method into which the approximation expression is substituted; and calculating an electric current in a time domain flowing in a specified element or calculating related values of the time domain making it possible to derive the electric current by solving the plurality of simultaneous differential equations formed by the forming and calculating the electric current.

18. A method of simulation using a moment method which segments an electronic apparatus into elements, so as to simulate an electric current and magnetic current flowing in the elements, comprising:

calculating a mutual impedance, a mutual admittance, and a mutual reaction at a sampling frequency and calculating approximation coefficients, expressing the mutual impedance, mutual admittance, and mutual reaction by approximation expressions in terms of exponents and exponent powers;

forming a plurality of simultaneous differential equations by setting the approximation coefficients to an initial value with respect to the simultaneous differential equations derived by performing a Fourier transform on a plurality of simultaneous equations of the moment method in which the approximation expressions are substituted; and calculating an electric current and a magnetic current in a time domain flowing through a specified element or calculating related values in the time domain making it possible to derive the electric current and the magnetic current by solving the plurality of simultaneous differential equations formed by the forming and calculating the electric current and the magnetic current.

19. A program storage medium controlling a computer using a moment method which segments an electronic apparatus into elements, so as to simulate the electric current flowing in said elements, by:

calculating the mutual impedance at a sampling frequency and calculating an approximation coefficient, expressing the mutual impedance by an approximation expression in terms of an exponent and exponent powers;

forming a plurality of simultaneous differential equations by setting the approximation coefficient and initial value with respect to the simultaneous differential equations derived by performing a Fourier transform on a plurality of simultaneous equations of the moment method into which the approximation expressions are substituted; and calculating an electric current in a time domain flowing in a specified element or calculating related values in the time domain making it possible to derive the electric current by solving the plurality of simultaneous differential equations formed by the forming and calculating the electric current.

20. A program storage medium controlling a computer using a moment method which segments an electronic apparatus into elements, so as to simulate an electric current and magnetic current flowing in the elements, by:

calculating a mutual impedance, a mutual admittance, and a mutual reaction at a sampling frequency and calculating a plurality of approximation coefficients, and expressing the mutual impedance, the mutual admittance, and the mutual reaction in a plurality of approximation expressions in terms of exponents and exponent powers;

forming a plurality of simultaneous differential equations by setting the approximation coefficients to an initial value with respect to the plurality of simultaneous differential equations derived by performing a Fourier transform on a plurality of simultaneous equations of the moment method in which the approximation expressions are substituted; and calculating an electric current and a magnetic current in a time domain flowing through a specified element or calculating related values in the time domain making it possible to derive the electric current and the magnetic current by solving the plurality of simultaneous differential equations formed by the forming and calculating the electric current and the magnetic current.

* * * * *